United States Patent
Moriwaki

(10) Patent No.: US 8,598,667 B2
(45) Date of Patent: Dec. 3, 2013

(54) SEMICONDUCTOR DEVICE

(75) Inventor: Hiroyuki Moriwaki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 75 days.

(21) Appl. No.: 13/376,911

(22) PCT Filed: Jun. 1, 2010

(86) PCT No.: PCT/JP2010/059246
§ 371 (c)(1),
(2), (4) Date: Dec. 8, 2011

(87) PCT Pub. No.: WO2010/143557
PCT Pub. Date: Dec. 16, 2010

(65) Prior Publication Data
US 2012/0086081 A1    Apr. 12, 2012

(30) Foreign Application Priority Data
Jun. 9, 2009    (JP) .................................. 2009-138470

(51) Int. Cl.
*H01L 23/62*    (2006.01)
(52) U.S. Cl.
USPC ........... 257/355; 257/356; 257/357; 257/358; 257/359
(58) Field of Classification Search
USPC ....................................................... 257/355
See application file for complete search history.

(56) References Cited

U.S. PATENT DOCUMENTS

| 5,693,973 | A | 12/1997 | Nakano et al. |
| 5,793,346 | A | 8/1998 | Moon |
| 5,867,138 | A | 2/1999 | Moon |

(Continued)

FOREIGN PATENT DOCUMENTS

| JP | 59-016378 A | 1/1984 |
| JP | 61-079258 A | 4/1986 |

(Continued)

OTHER PUBLICATIONS

Official Communication issued in International Patent Application No. PCT/JP2010/059246, mailed on Jun. 29, 2010.

(Continued)

*Primary Examiner* — Ajay K Arora
(74) *Attorney, Agent, or Firm* — Keating & Bennett, LLP

(57) ABSTRACT

A semiconductor device includes a thin-film diode (1) and a protection circuit with a protection diode (20). The thin-film diode (1) includes: a semiconductor layer with first, second and channel regions; a gate electrode; a first electrode (S1) connected to the first region and the gate electrode; and a second electrode (D1) connected to the second region. The conductivity type of the thin-film diode (1) may be N-type and the anode electrode of the protection diode (20) may be connected to a line (3) that is connected to either the gate electrode or the first electrode of the thin-film diode (1). Or the conductivity type of the thin-film diode may be P-type and the cathode electrode of the protection diode may be connected to the line that is connected to either the gate electrode or the first electrode of the thin-film diode. The protection circuit includes no other diodes that are connected to the line (3) so as to have a current flowing direction opposite to the protection diode's (20). As a result, deterioration of a thin-film diode due to ESD can be reduced with an increase in circuit size minimized.

18 Claims, 20 Drawing Sheets

(56) References Cited

U.S. PATENT DOCUMENTS

| | | |
|---|---|---|
| 5,874,828 A | 2/1999 | Lee |
| 6,304,305 B1 | 10/2001 | Matsumoto et al. |
| 6,333,661 B1 | 12/2001 | Ando et al. |
| 2005/0099068 A1 | 5/2005 | Kimura |
| 2006/0002045 A1 | 1/2006 | Kobashi |
| 2006/0278929 A1* | 12/2006 | Liu et al. .................. 257/360 |
| 2007/0279093 A1 | 12/2007 | Senda et al. |
| 2008/0067511 A1 | 3/2008 | Kim |
| 2008/0079859 A1* | 4/2008 | Ota ............................... 349/40 |

FOREIGN PATENT DOCUMENTS

| | | |
|---|---|---|
| JP | 03-206666 A | 9/1991 |
| JP | 06-51346 A | 2/1994 |
| JP | 08-148650 A | 6/1996 |
| JP | 08-262407 A | 10/1996 |
| JP | 09-127486 A | 5/1997 |
| JP | 09-222591 A | 8/1997 |
| JP | 11-119256 A | 4/1999 |
| JP | 11-174970 A | 7/1999 |
| JP | 2000-098338 A | 4/2000 |
| JP | 2002-324842 A | 11/2002 |
| JP | 2007-042775 A | 2/2007 |
| JP | 2007-082239 A | 3/2007 |
| JP | 2008-022539 A | 1/2008 |

OTHER PUBLICATIONS

English translation of Official Communication issued in corresponding International Application PCT/JP2010/059246, mailed on Jan. 26, 2012.

* cited by examiner (a)

(b)

(c)

(a)

(b)

(c)

(n$^{th}$ STAGE)

(a)

(b)

SEMICONDUCTOR DEVICE

TECHNICAL FIELD

The present invention relates to a semiconductor device with a circuit including an electrostatic discharge (ESD) protection circuit.

BACKGROUND ART

A semiconductor device with a circuit, such as an active-matrix substrate, ordinarily has a built-in circuit for protecting semiconductor components in that circuit from ESD. Such a protection circuit is called an "ESD protection circuit".

A general ESD protection circuit will be described with reference to FIG. 35, which illustrates an exemplary ESD protection circuit provided for an IC internal circuit with a CMOS (complementary metal oxide semiconductor) structure. The ESD protection circuit shown in FIG. 35 includes a protective resistor R, which is arranged between an input terminal and the CMOS structure, and two protection diodes D1 and D2 with mutually different polarities. Each of these two diodes D1 and D2 is connected to the input signal line of the CMOS structure.

In the ESD protection circuit, when the input terminal receives static electricity, its potential either rises (+) or falls (−). If the potential rises (+), the protection diode D1 turns ON and pushes positive charges to a VCC line. On the other hand, if the potential falls (−), the protection diode D2 turns ON and pushes negative charges to a VSS line. In this case, the direction of the current flowing is regulated by the protective resistor R.

On the active-matrix substrate of a display device, a circuit including thin-film transistors (TFTs), which function as switching elements for pixels, is usually formed by patterning a semiconductor film of silicon, metal oxide semiconductor, or any other suitable material. Also, the active-matrix substrate normally has a protection circuit in order to prevent those TFTs or interconnects from getting damaged by static electricity (see Patent Document No. 1, for example).

FIG. 36 illustrates a conventional active-matrix substrate with protection circuits. This configuration is disclosed in Patent Document No. 1.

As shown in FIG. 36, the active-matrix substrate has an array of thin-film transistors 240, which includes a number of scan lines 203 and a number of signal lines 204 that have been formed on an insulating substrate and a number of thin-film transistors 205 that are arranged at their intersections. Each of those thin-film transistors 205 has its source electrode, gate electrode and drain electrode connected to its associated signal line 204, its associated scan line 203, and its associated pixel electrode (not shown), respectively. Around this array of thin-film transistors 240, each scan line 203 is connected to a reference potential line 231 via its associated protection circuit 250. Each protection circuit 250 includes two thin-film diodes 228 and 229 with mutually different polarities. Likewise, each signal line 204 is also connected to a reference potential line 232 via its associated protection circuit 251. According to such a configuration, even if positive or negative charges are applied to either a scan line 203 or a signal line 204, the protection circuit 250 or 251 can push those charges to its associated reference potential line 231 or 232.

It should be noted that each of the thin-film diodes 226 through 229, which are included in the protection circuits 250 and 251 shown in FIG. 36, has a structure in which the source and gate of a thin-film transistor (e.g., a pixel thin-film transistor 205) are short-circuited together. A diode with such a structure in which the gate and source or drain of a thin-film transistor are short-circuited together will be referred to herein as a "three-terminal diode".

Furthermore, it has recently become more and more often that not only such thin-film transistors functioning as switching elements but also some or all of TFTs for use in a peripheral circuit such as a driver are arranged on an active-matrix substrate. The peripheral circuit is not located in an area of the active-matrix substrate where pixels are arranged (which will be referred to herein as a "display area") but in another area of the active-matrix substrate (which will be referred to herein as a "frame area"). In that case, protection circuits also need to be provided for those elements such as thin-film transistors that form the peripheral circuit (see Patent Document No. 2, for example).

FIG. 37 illustrates an insulated gate transistor circuit, which is provided to apply a clock signal to a driver that is arranged in the frame area of an active-matrix substrate. The circuit configuration shown in FIG. 37 is disclosed in Patent Document No. 2.

The circuit shown in FIG. 37 includes an insulated gate transistor circuit 1001, which is arranged between an electrode pad (OLD pad) 1011 that receives a clock signal and a driver circuit section, and two protection circuits 1013 and 1016. The protection circuit 1013 is arranged at the input end of the circuit 1001 and includes two diodes 1014 and 1015 with mutually opposite polarities. On the other hand, the protection circuit 1016 is arranged at the output end of the circuit 1001 and includes two diodes 1017 and 1018 with mutually opposite polarities. The diodes 1014 and 1017 are connected to a VDD line, while the diodes 1015 and 1018 are grounded. According to such a configuration, the static electricity that has been externally applied to a line 1019 through the CLB pad 1011 can be discharged by the protection circuit 1013 and the static electricity that has been applied from the driver circuit to the line 1019 can be discharged by the protection circuit 1016.

As can be seen from the examples illustrated in FIGS. 35, 36 and 37, the conventional ESD protection circuits are provided mainly for the purpose of protecting a three-terminal thin-film transistor. Also, each of those ESD protection circuits includes at least two diodes with mutually opposite polarities, which are forward-biased and reverse-biased, respectively, so as to push away the charges applied to the line to protect, no matter whether the charges are positive or negative. Furthermore, that ESD protection circuit is arranged on either the input or output end of a circuit including thin-film transistors to protect or even on both ends thereof. That is why the ESD protection circuit can prevent static electricity from entering a circuit with three-terminal thin-film transistors on an insulating substrate through either the input or output end thereof. Consequently, by providing such a protection circuit for an active-matrix-addressed display device, for example, the protection circuit can prevent static electricity from entering a driver circuit in the frame area (which may be a monolithic driver) from an external connector pad (which is connected to the driver at the input end), a scan line, or a signal line (which is located at the output end of the driver).

CITATION LIST

Patent Literature

Patent Document No. 1: Japanese Patent Application Laid-Open Publication No. 11-119256
Patent Document No. 2: Japanese Patent Application Laid-Open Publication No. 2000-98338

SUMMARY OF INVENTION

Technical Problem

Each of the conventional protection circuits shown in FIGS. 35 to 37 includes at least two diodes. For that reason, with such a protection circuit, the circuit size inevitably increases, which is a problem. For example, if such a conventional protection circuit is applied to a monolithic driver, then the frame area of the display device should increase, and therefore, the display area could decrease instead.

On top of that, the conventional protection circuit is arranged so as to protect three-terminal thin-film transistors. However, the present inventors discovered via experiments that not so much three-terminal transistors as three-terminal diodes are easily destroyed by static electricity. The reasons will be described in detail later. That is why a protection circuit with the conventional configuration could not prevent a circuit including three-terminal diodes as its internal circuit components from having its device performance affected by static electricity or operating erroneously due to the presence of static electricity.

It is therefore an object of the present invention to efficiently prevent elements included in a circuit on an insulating substrate from being destroyed by static electricity without increasing the size of the circuit excessively.

Solution to Problem

A semiconductor device according to the present invention includes a circuit that has been formed on a substrate and that includes a thin-film diode and a protection circuit with a protection diode. The thin-film diode includes: at least one semiconductor layer, which is arranged on the substrate and which has a first region, a second region and a channel region that is located between the first and second regions; a gate electrode, which is arranged so as to overlap with the channel region; a gate insulating layer, which is arranged between the gate electrode and the semiconductor layer; a first electrode, which is arranged on the first region and which is electrically connected to the first region and the gate electrode; and a second electrode, which is arranged on, and electrically connected to, the second region. In this semiconductor device, (a) the conductivity type of the thin-film diode may be N-type and the anode electrode of the protection diode may be connected to a line that is connected to either the gate electrode or the first electrode of the thin-film diode. Or (b) the conductivity type of the thin-film diode may be P-type and the cathode electrode of the protection diode may be connected to the line that is connected to either the gate electrode or the first electrode of the thin-film diode. The protection diode and the thin-film diode are not connected in parallel. The protection circuit includes no other diodes that are connected to the line so as to have a current flowing direction that is opposite to the protection diode's.

In one preferred embodiment, the protection diode includes: at least one semiconductor layer, which is arranged on the substrate and which has a first region, a second region and a channel region that is located between the first and second regions; a gate electrode, which is arranged so as to overlap with the channel region; a gate insulating layer, which is arranged between the gate electrode and the semiconductor layer; a first electrode, which is arranged on the first region and which is electrically connected to the first region and the gate electrode; and a second electrode, which is arranged on, and electrically connected to, the second region.

The respective semiconductor layers of the thin-film diode and the protection diode may be made of the same semiconductor film.

The semiconductor device may further include multiple thin-film transistors, which have the same conductivity type as the thin-film diode. And the respective semiconductor layers of the thin-film transistors and the thin-film diode may be made of the same semiconductor film.

In another preferred embodiment, no protection circuits are provided for the line that is connected to the gate electrode of each thin-film transistor.

In still another preferred embodiment, the circuit includes either an input section for inputting a signal from an external device to the circuit or an output section for outputting a signal from the circuit to an external device. A line that connects the thin-film diode and the protection diode together has a shorter length than a line that connects the input or output section to the protection diode together.

The line that connects the thin-film diode and the protection diode together preferably has a length of 1 mm or less.

In another preferred embodiment, (a) the conductivity type of the thin-film diode may be N-type and the anode electrode of the protection diode may be connected to the line that is connected to either the gate electrode or the first electrode of the thin-film diode. When the anode electrode of the protection diode is high, the cathode electrode of the protection diode may also be high.

In an alternative preferred embodiment, (a) the conductivity type of the thin-film diode may be N-type and the anode electrode of the protection diode may be connected to the line that is connected to either the gate electrode or the first electrode of the thin-film diode. The cathode electrode of the protection diode may be connected to a line leading to a VDD power supply.

In still another preferred embodiment, (b) the conductivity type of the thin-film diode may be P-type and the cathode electrode of the protection diode may be connected to the line that is connected to either the gate electrode or the first electrode of the thin-film diode. When the cathode electrode of the protection diode is low, the anode electrode of the protection diode may also be low.

In an alternative preferred embodiment, (b) the conductivity type of the thin-film diode may be P-type and the cathode electrode of the protection diode may be connected to the line that is connected to either the gate electrode or the first electrode of the thin-film diode. The anode electrode of the protection diode may be connected to a line leading to a VSS power supply.

The circuit may include a shift register.

Advantageous Effects of Invention

The present invention can reduce significantly the harmful effect of electrostatic discharge on three-terminal diodes, which are included in a circuit on an insulating substrate, without excessively decreasing the circuit size. As a result, the present invention can prevent efficiently the circuit from operating erroneously due to the ESD.

The present invention is particularly effective when applied to an active-matrix substrate with a driver circuit.

BRIEF DESCRIPTION OF DRAWINGS

FIG. 21(a) is a schematic plan view illustrating an active-matrix substrate for a liquid crystal display (LCD) panel, while FIG. 21(b) is a plan view schematically illustrating the structure of a single pixel thereof.

DESCRIPTION OF EMBODIMENTS

When a circuit including thin-film transistors and thin-film diodes is fabricated by patterning a semiconductor film on an insulating substrate, sometimes three-terminal thin-film diodes are formed as described above in order to fabricate the thin-film transistors and the thin-film diodes by the same process. However, the present inventors discovered and confirmed via experiments that the three-terminal thin-film diodes in such a circuit are more easily affected by static electricity than three-terminal thin-film transistors are. The reason will be described below.

In this description, diodes that form a major part of a circuit and that are indispensable to allow that circuit to perform its intended function will be referred to herein as "in-circuit diodes", while diodes included in a protection circuit will be referred to herein as "protective diodes" to clearly distinguish those two types of diodes from each other.

Figure 1:
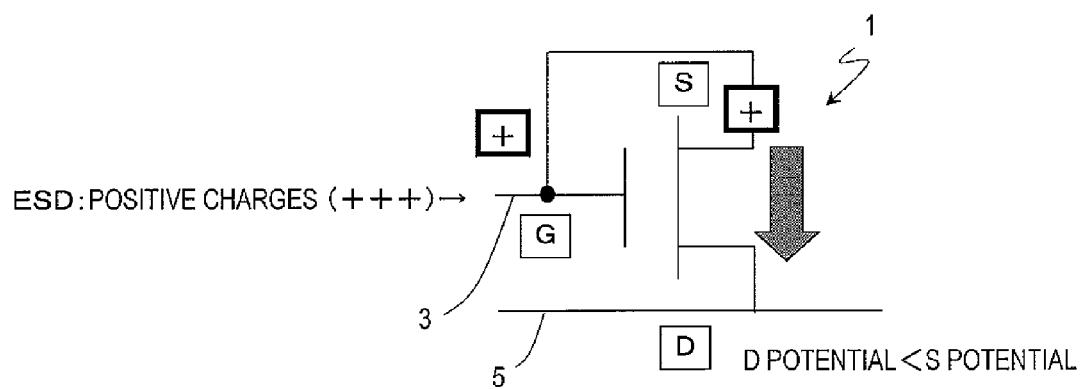
FIG. 1 illustrates how static electricity affects an in-circuit diode (of N-channel type).
Figure 2:
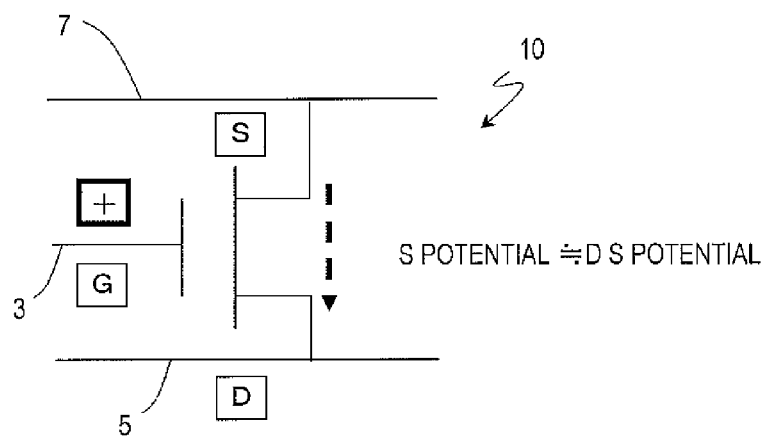
FIG. 2 illustrates how static electricity affects an in-circuit transistor (of N-channel type).

FIGS. 1 and 2 illustrate how static electricity affects an in-circuit diode and an in-circuit transistor, which are supposed to be an N-channel diode and an N-channel transistor, respectively, in this example.

The in-circuit diode 1 shown in FIG. 1 has the three terminals of gate, source and drain electrodes G, S and D. The gate electrode G is connected to a line 3, while the drain electrode D is connected to another line 5 (such as a VDD line). The source electrode S is short-circuited with the gate electrode G. In such an in-circuit diode 1, when positive static electricity is input through the line 3 to the gate electrode G, a positive voltage is also applied simultaneously to the source electrode S that is connected to the gate electrode G. That is why the source electrode S comes to have a higher potential than the drain electrode D, thus turning the diode 1 ON and producing a large amount of current that flows between the source and drain electrodes S and D. As a result, the channel layer of this diode 1 might deteriorate.

On the other hand, in the in-circuit transistor 10 shown in FIG. 2, its source electrode S is not short-circuited with its gate electrode G but connected to a third line 7, neither the line 3 nor the line 5. In this transistor, the electrodes G, D and S are connected to three different lines. That is why even when positive static electricity is input to the gate electrode G, for example, the potential levels at the source and drain electrodes S and D are still kept substantially equal to each other. Thus, it is highly probable that the transistor 10 does not turn ON. Consequently, the in-circuit transistor 10 is less easily affected by static electricity and the channel layer of the in-circuit transistor 10 is much less likely to deteriorate due to the static electricity.

With these results in mind, the present inventors discovered that if a protection circuit is provided for a three-terminal diode, which is particularly easily affected by static electricity among various kinds of in-circuit elements, the protection circuit can effectively prevent static electricity from deteriorating the performance of that in-circuit element or causing the circuit to operate erroneously. This is the basic idea of the present invention.

FIGS. 3(a) and 4(a) illustrate circuit configurations to adopt in a preferred embodiment of the present invention. Specifically, FIG. 3(a) illustrates a circuit configuration to use in a situation where the conductivity type of the in-circuit diode to protect is N-type (i.e., if the in-circuit diode is an N-channel diode). On the other hand, FIG. 4(a) illustrates a circuit configuration to use in a situation where the conductivity type of the in-circuit diode to protect is P-type (i.e., if the in-circuit diode is a P-channel diode).

The circuit shown in FIG. 3(a) includes an N-channel in-circuit diode 1 and a protection circuit with a protection diode 20 that protects the in-circuit diode 1. The in-circuit diode 1 is a three-terminal diode that has a gate electrode G1, a first electrode (source electrode) S1 and a second electrode (drain electrode) D1. And its first electrode S1 and gate electrode G1 are short-circuited with each other.

In this description, one of two electrodes of a three-terminal diode, which is short-circuited with the gate electrode, will be referred to herein as a "first electrode", while the other electrode as a "second electrode". That is why supposing current flows from the source to the drain, the first electrode of an N-channel diode is its source electrode and the first electrode of a P-channel diode is its drain electrode.

The anode electrode of the protection diode 20 is connected to a line 3 that is electrically connected to the gate electrode G1 of the in-circuit diode 1, while the cathode electrode thereof is connected to a line 9 (which is a VDD line in this example). It should be noted that the line 9 does not have to be a VDD line but may also be a line that has a higher potential than the VDD line. Also, it is preferred that the line 9 be not connected to a transistor but floating. Furthermore, as shown in FIG. 3(b), the signal on the line 9 may be a clock signal that goes high when the signal on the line 3 goes high. That is to say, the signal potential on the line 9 just needs to be equal to or higher than the one on the line 3. In that case, no current flows from the line 3 to the line 9, the waveform never comes to have blunted edges, and the power dissipation never increases.

In the example illustrated in FIG. 3(a), the protection diode 20 is a three-terminal diode including a gate electrode, a first electrode and a second electrode. The conductivity type of the protection diode 20 is N-type, which is the same as that of the in-circuit diode 1. The gate electrode and the first electrode of the protection diode 20 are connected to the line 3, and the second electrode thereof is connected to the VDD line 9.

When positive static electricity enters the circuit illustrated in FIG. 3(a) through the line 3, current flows from the line 3 to the VDD line 9 via the protection diode 20. As a result, the amount of current that flows through the gate electrode G1 of the in-circuit diode 1 to protect decreases significantly, so does the amount of current that flows between the first and second electrodes S1 and D1 of the in-circuit diode 1. Consequently, the protection diode 9 can prevent the in-circuit diode 1 from deteriorating due to the application of static electricity and can also prevent the circuit from operating erroneously.

On the other hand, no other protection diode is arranged on the line 3 so that current flows through the diode in the opposite direction to the protection diode 20. That is why negative static electricity that has entered the circuit through the line 3 is applied to the in-circuit diode 1. As a result, the first electrode S1 of the in-circuit diode 1 comes to have a lower potential than the second electrode D1 thereof. Even so, no current flows between those first and second electrodes S1 and D1, and therefore, the in-circuit diode 1 is much less likely to deteriorate due to the application of the negative static electricity. For that reason, even without providing such another protection diode so that current flows through it in the opposite direction to the protection diode 20, the in-circuit diode 1 can still be appropriately protected from ESD just as intended.

Although the protection diode 20 is supposed to be N-channel type in the example illustrated in FIG. 3(a), a P-channel protection diode 22 may also be provided as shown in FIG. 3(c).

The circuit shown in FIG. 4(a) includes a P-channel in-circuit diode 2 and a protection circuit with a protection diode 22 that protects the in-circuit diode 2. The in-circuit diode 2 is a three-terminal diode that has a gate electrode G2, a first electrode (drain electrode) D2 and a second electrode (source electrode) S2. And its first electrode D2 and gate electrode G2 are short-circuited with each other.

The cathode electrode of the protection diode 22 is connected to a line 3 that is electrically connected to the gate electrode G2 of the in-circuit diode 2, while the anode electrode thereof is connected to a line 8 (which is a VSS line in this example). It should be noted that the line 8 does not have to be a VSS line but may also be a line that has a lower potential than the VSS line. Also, it is preferred that the line 8 be not connected to a transistor but floating. Furthermore, as shown in FIG. 4(b), the signal on the line 8 may be a clock signal that goes low when the signal on the line 3 goes low. That is to say, the signal potential on the line 8 just needs to be equal to or lower than the one on the line 3. In that case, no current flows from the line 3 to the line 8, the waveform never comes to have blunted edges, and the power dissipation never increases.

When negative static electricity enters the circuit illustrated in FIG. 4(a) through the line 3, current flows from the VSS line 8 to the line 3 via the protection diode 22. As a result, the protection diode 22 can prevent the negative static electricity from being applied to the gate electrode G2 of the in-circuit diode 2 and can prevent a large amount of current from flowing from the second electrode S2 to the first electrode D2.

In this example, no other protection diode is arranged on the line 3 so that current flows through the diode in the opposite direction to the protection diode 22. However, even if negative static electricity enters the gate electrode G2 of the in-circuit diode 2 through the line 3, no current flows between the second and first electrodes S2 and D2 of the in-circuit diode 2. That is why even without providing such another protection diode, the in-circuit diode can still be appropriately protected from ESD just as intended.

Although the protection diode 20 is a P-channel type in the example illustrated in FIG. 4(a), an N-channel protection diode 20 may also be used as shown in FIG. 4(c).

Figure 3:
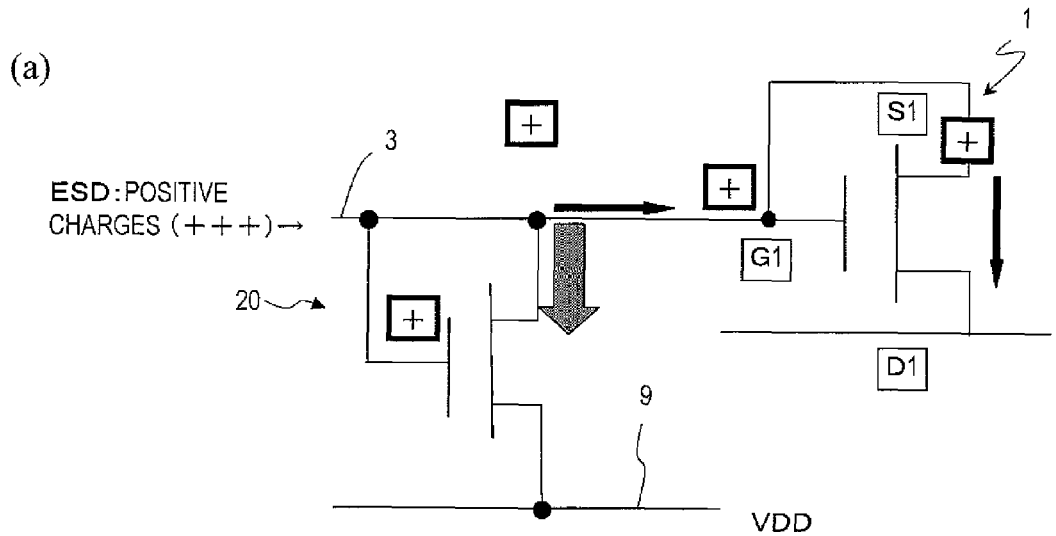
FIGS. 3(a) through 3(c) illustrate a circuit as a preferred embodiment of the present invention, wherein FIGS. 3(a) and 3(c) each illustrates an N-channel in-circuit diode and a protection circuit to protect the in-circuit diode, and FIG. 3(b) show how the waveforms of signals vary relative to each other on the lines 3 and 9 of these circuits.
Figure 3:
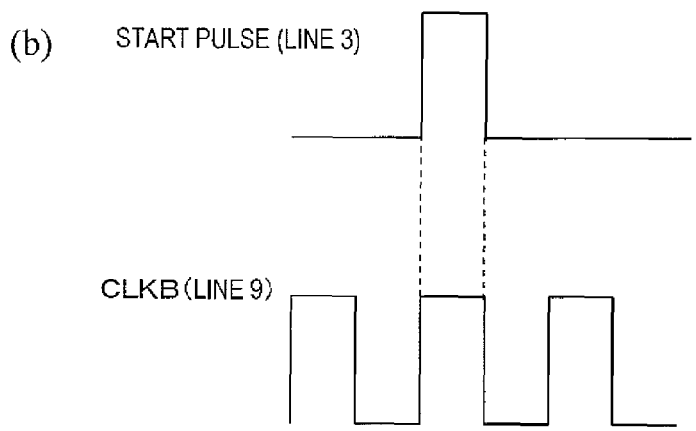
Figure 3:
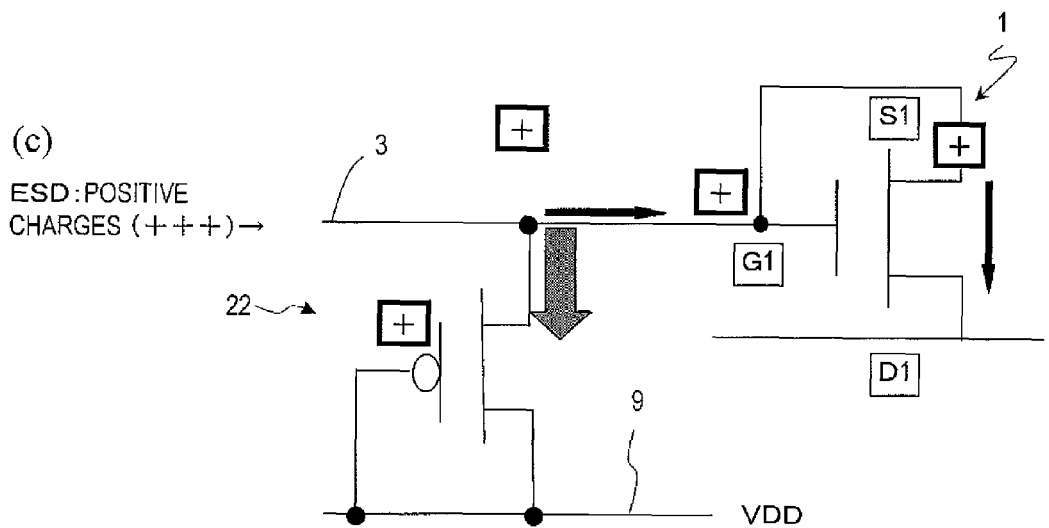
Figure 4:
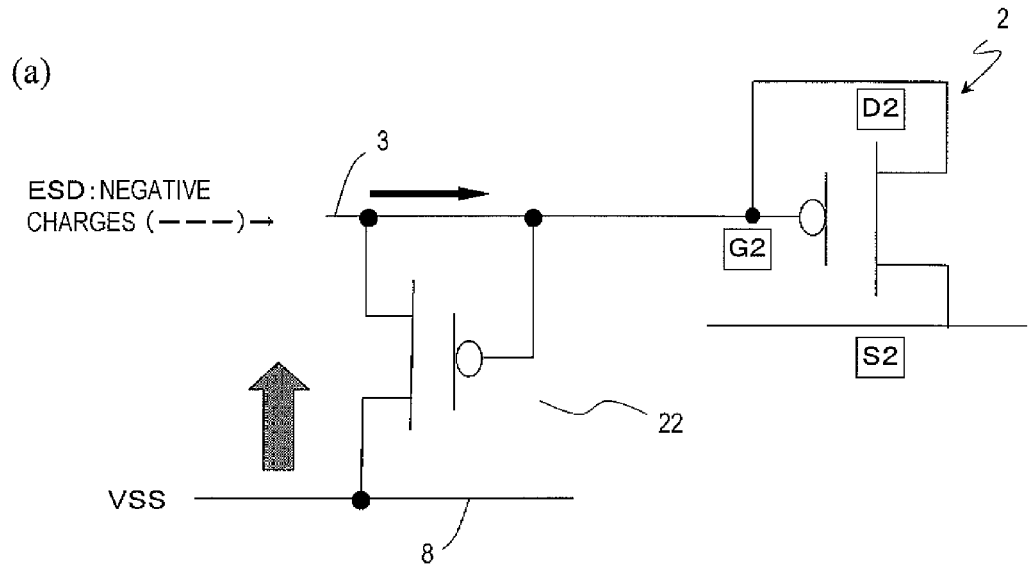
FIGS. 4(a) through 4(c) illustrate a circuit as a preferred embodiment of the present invention, wherein FIGS. 4(a) and 4(c) each illustrates a P-channel in-circuit diode and a protection circuit to protect the in-circuit diode, and FIG. 4(b) show how the waveforms of signals vary relative to each other on the lines 3 and 8 of these circuits.
Figure 4:
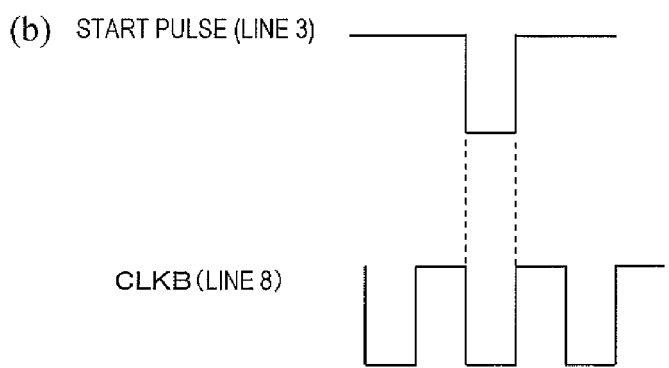
Figure 4:
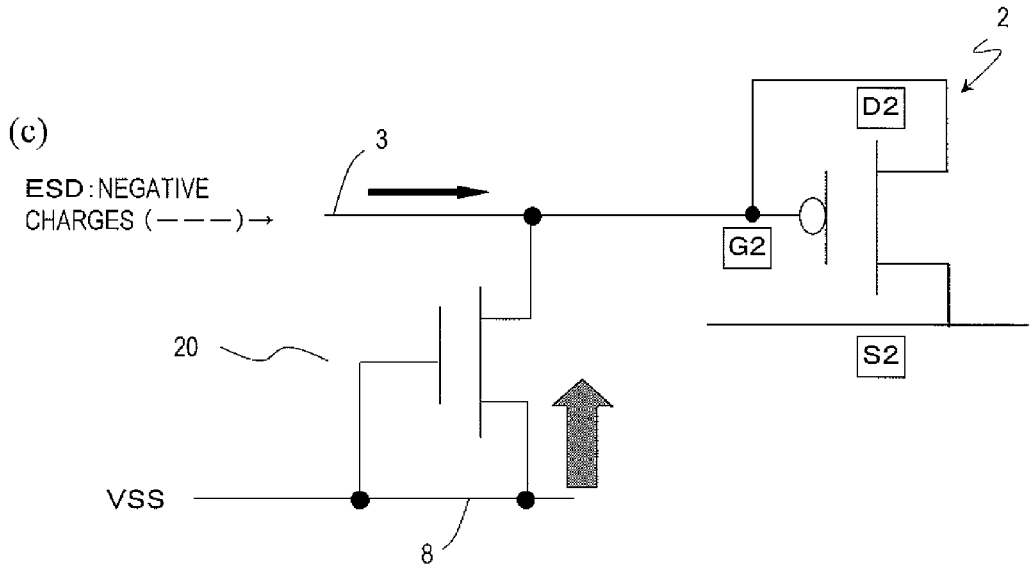

As can be seen, if the conductivity type of the in-circuit diode 1 to protect is N-type as shown in FIG. 3, the protection diode 20, 22 needs to be arranged so as to have such a bias direction that minimizes storage of positive charges on the gate electrode G1 and the first electrode S1 of the in-circuit diode 1. That is to say, if positive charges are applied onto the line 3 that is connected to either the gate electrode G1 or the first electrode S1 of the in-circuit diode 1, the protection diode 20 needs to be arranged so as to push those positive charges away from the line 3 into another line 9 by way of the protection diode 20. On the other hand, if the conductivity type of the in-circuit diode 2 to protect is P-type as shown in FIG. 4, the protection diode 20, 22 needs to be arranged so as to have such a bias direction that minimizes storage of negative charges on the gate electrode G2 and the first electrode D2 of the in-circuit diode 2. That is to say, if negative charges are applied onto the line 3 that is connected to either the gate electrode G2 or the first electrode D2 of the in-circuit diode 2, the protection diode 22 needs to be arranged so as to push those positive charges away from the line 3 into another line 8 by way of the protection diode 22.

According to this preferred embodiment, since a protection circuit is provided for the three-terminal diode 1 or 2 that is particularly easily affected by static electricity among various types of in-circuit elements, the diode 1 or 2 can be protected from ESD efficiently without excessively increasing the circuit size.

Figure 35:
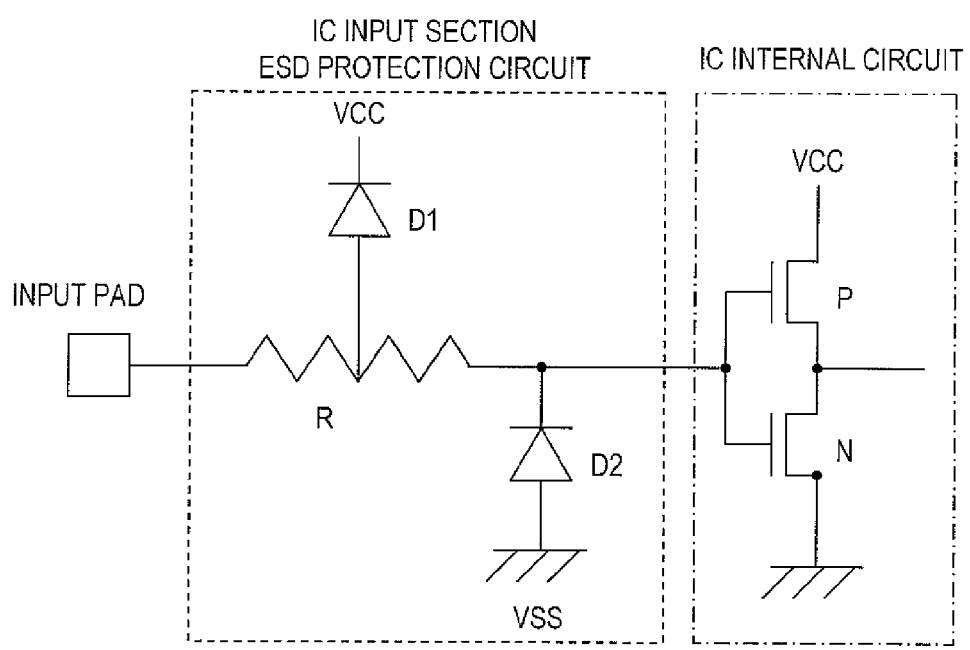
FIG. 35 illustrates an example of a conventional ESD protection circuit provided for an IC internal circuit.
Figure 36:
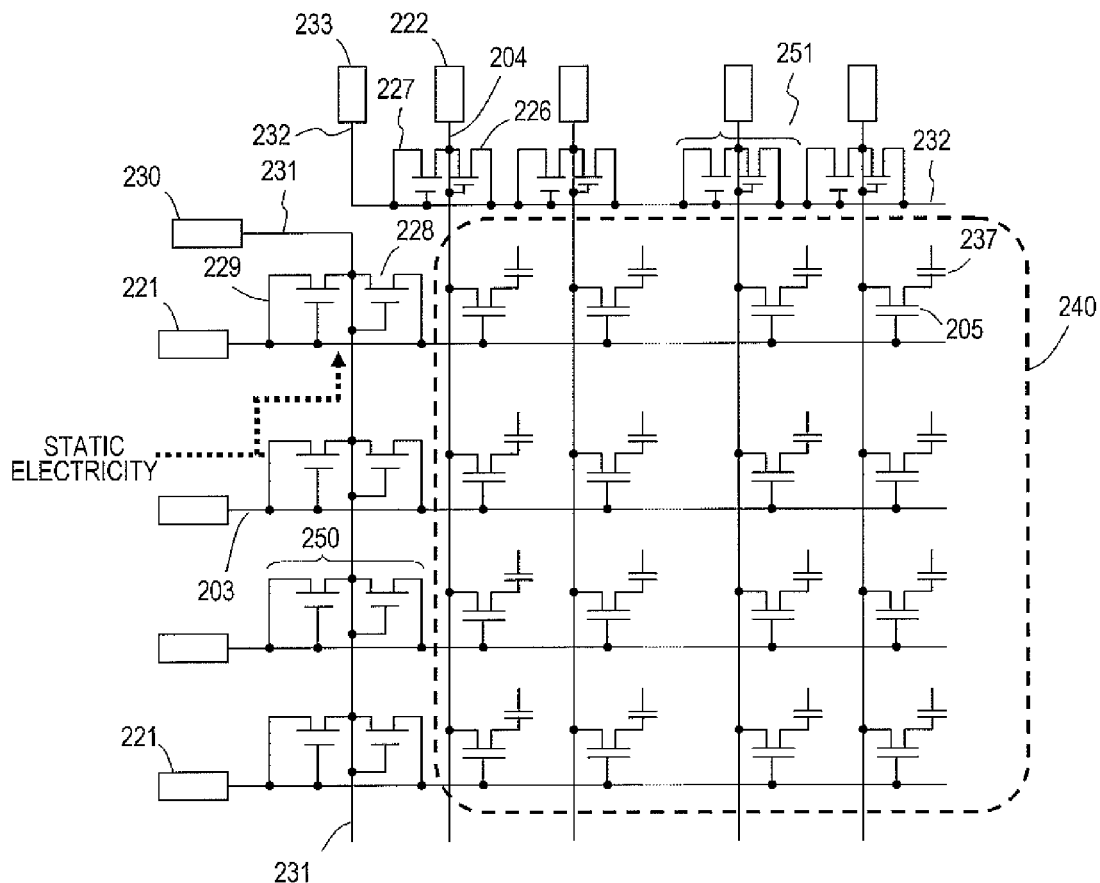
FIG. 36 illustrates a conventional active-matrix substrate with an ESD protection circuit.
Figure 37:
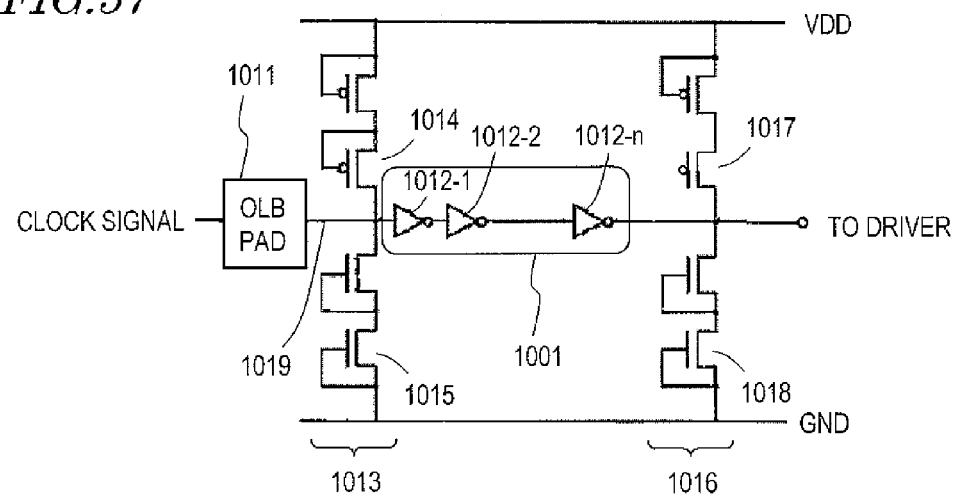
FIG. 37 illustrates a conventional circuit with an ESD protection circuit.

In addition, the protection circuit of this preferred embodiment does not include any additional protection diode that is arranged so that current flows through it in the opposite direction to the protection diode 20 or 22. Thus, compared to the conventional protection circuit (see FIGS. 35 to 37), the number of protection diodes to provide can be halved. As a result, the circuit size can be reduced more effectively with the in-circuit diode 1 or 2 protected from ESD appropriately.

The protection diode 20 or 22 of this preferred embodiment may be arranged at any position as long as if a voltage that is equal to or higher than a predetermined voltage is applied to the in-circuit diode 1 or 2, the protection diode 20 or 22 turns ON and produces discharge before the in-circuit diode 1 or 2 turns ON. Also, according to this preferred embodiment, the gate electrode G1 or G2 and the first electrode S1 or D2 of the in-circuit diode 1 or 2 do not always have to be directly connected to an input/output section with the line 3. Optionally, another in-circuit element such as a transistor may be interposed between the input/output section and the in-circuit diode 1 or 2.

The protection diode 20 or 22 is preferably arranged on the line 3 as close to the in-circuit diode 1 or as possible. The conventional protection circuit is arranged at the input/output section of a circuit. That is why the line that connects the protection circuit to an in-circuit element to protect is so long as to work as a sort of antenna that attracts static electricity. As a result, the static electricity could enter the element to protect. On the other hand, if the protection circuit is arranged close to the element to protect (i.e., the in-circuit diode 1 or 2), then the performance of the in-circuit diode 1 or 2 does not deteriorate due to static electricity not only when the static electricity enters the circuit through the input/output section thereof but also when static electricity is generated inside the circuit during the manufacturing process and enters the circuit through the line 3.

According to this preferred embodiment, the protection diode 20 or 22 just needs to be arranged to have the predetermined bias direction described above and does not always have to be a three-terminal thin-film diode as described above. Nevertheless, it will be more beneficial to simplify the manufacturing process if the protection diode 20 or 22 is a three-terminal diode because the protection diode 20 or 22 and the in-circuit diode 1 or 2 can be formed then by patterning the same semiconductor film. In that case, the in-circuit diode 1 or 2 and the protection diode 20 or 22 preferably have the same conductivity type.

The circuit of this preferred embodiment preferably includes not only the in-circuit diode 1 or 2 but also a thin-film transistor as well. This is particularly preferred because a thin-film transistor, a protection diode and an in-circuit diode can be formed at a time by patterning the same semiconductor film. In that case, it is even more preferred that all of these elements be three-terminal ones because those elements can be fabricated then by performing the same series of manufacturing process steps. It should be noted that no protection circuit may be provided for the thin-film transistor in the circuit (which will be referred to herein as an "in-circuit transistor"). This is because a three-terminal thin-film transistor is much less easily affected by ESD than a thin-film diode is. On top of that, by omitting such a protection circuit that protects the thin-film transistor, the circuit size can be reduced even more effectively.

(Embodiment 1)

Hereinafter, a First Preferred Embodiment of a semiconductor device according to the present invention will be described. The semiconductor device of this preferred embodiment has a circuit that includes a three-terminal thin-film diode (which will be referred to herein as an "in-circuit diode") and an ESD protection circuit to protect the thin-film diode. It should be noted that the semiconductor device of this preferred embodiment just needs to have such a circuit and may be implemented as a circuit such as a shift register, an active-matrix substrate or display device with such a circuit, or in any other arbitrary form.

Hereinafter, specific examples of a circuit according to this preferred embodiment will be described with reference to the accompanying drawings.

FIGS. 5 through 18 illustrate respective parts of circuits representing Examples #1 through #14 of the present invention. In each of these specific examples, both the in-circuit diode 1 and the protection diode 20 are N-channel three-terminal thin-film diodes. In FIGS. 5 through 18, any component having substantially the same function is identified by the same reference numeral and description thereof will be omitted herein for the sake of simplicity.

Examples #1 to #3

Figure 5:
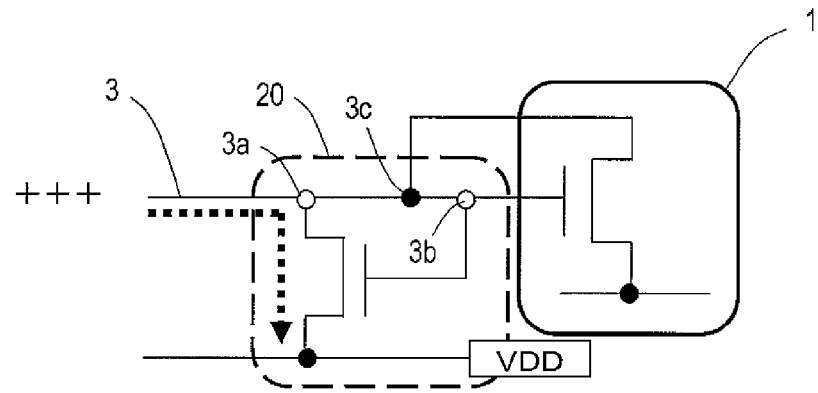
FIG. 5 illustrates a part of a circuit as Example #1 of the present invention.

FIG. 5 illustrates a circuit as Example #1 of the present invention, which includes an in-circuit diode 1 and a protection circuit with a protection diode 20. The first electrode and gate electrode of the protection diode 20 are connected to a line 3, which is connected to the gate electrode of the in-circuit diode 1. On the other hand, the second electrode of the protection diode 20 is connected to a VDD line. Supposing the first electrode and gate electrode of the protection diode 20 are connected to the line 3 at connection points 3a and 3b, respectively, the first electrode of the in-circuit diode 1 is connected to the line 3 at a connection point 3c between those two connection points 3a and 3b.

According to this Example #1, when positive charges are applied onto the line 3, current flows from the line 3 toward the VDD line by way of the protection diode 20 as illustrated in FIG. 5. Consequently, the amount of current that flows into the in-circuit diode 1 can be reduced significantly.

It should be noted that as long as the positive charges that have entered the circuit through the line 3 reach the first electrode of the protection diode 20 before entering the gate electrode of the in-circuit diode 1, the connection points 3a, 3b and 3C between the line 3 and the first and gate electrodes of the protection diode 20 and between the line 3 and the first electrode of the in-circuit diode 1 may be arranged in any other order.

Figure 6:
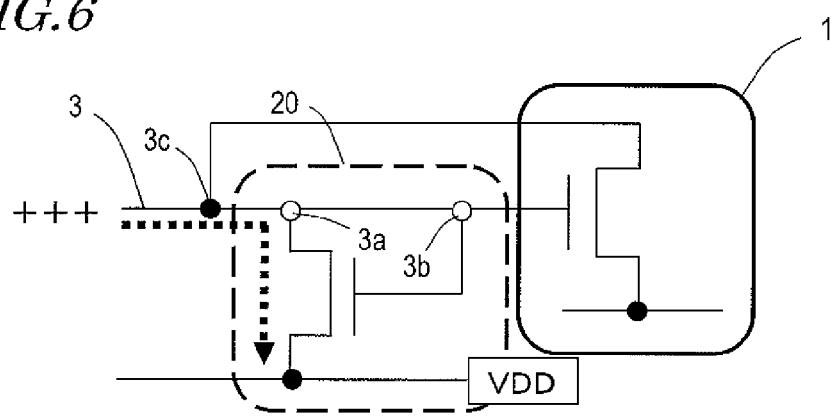
FIG. 6 illustrates a part of a circuit as Example #2 of the present invention.
Figure 7:
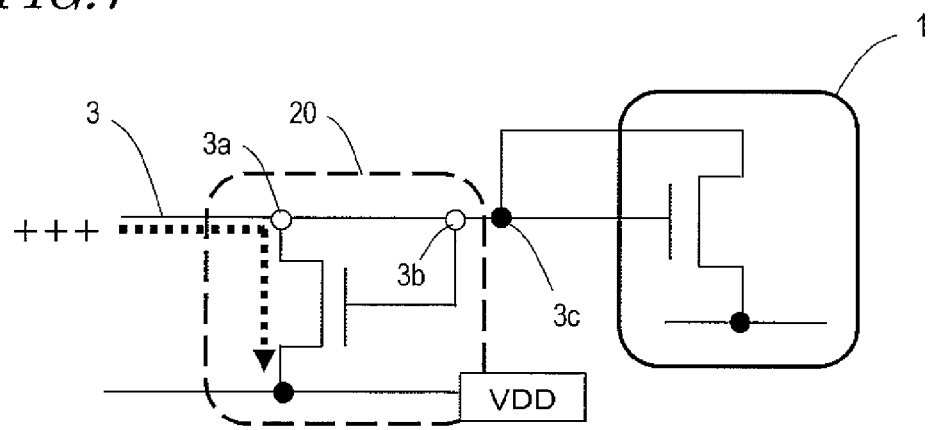
FIG. 7 illustrates a part of a circuit as Example #3 of the present invention.

FIGS. 6 and 7 illustrate examples of circuits in which the connection points 3a, 3b and 3c are arranged in different orders. Specifically, as in Example #2 illustrated in FIG. 6, the connection points 3a and 3b of the gate and first electrodes of the protection diode 20 to the line 3 may be located between the connection point 3c of the first electrode of the in-circuit diode 1 to the line 3 and the gate electrode of the in-circuit diode 1. Alternatively, as in Example #3 illustrated in FIG. 7, the connection point 3c of the first electrode of the in-circuit diode 1 to the line 3 may be located closer to the gate electrode of the in-circuit diode 1 than the connection points 3a and 3b of the protection diode 20 to the line 3 are.

Examples #4 and #5

Figure 8:
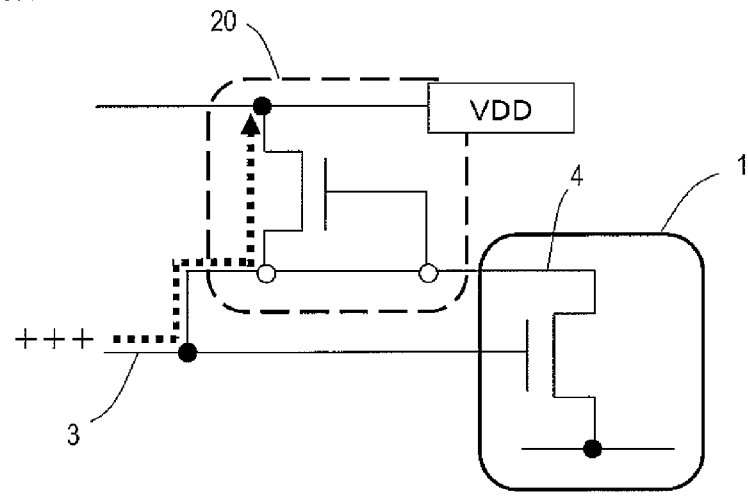
FIG. 8 illustrates a part of a circuit as Example #4 of the present invention.

FIG. 8 illustrates Example #4 of the present invention, in which the first electrode of the in-circuit diode 1 and the line 3 are connected together with a line 4 that is connected to the first and gate electrodes of the protection diode 20. In this manner, the first and gate electrodes of the protection diode 20 do not have to be connected to the line 3 but may also be connected to the line 4 that connects the first electrode of the in-circuit diode 1 to the line 3. In the circuit of this Example #4, when positive charges are applied onto the line 3, current also flows from the line 4 toward the VDD line by way of the protection diode 20. Consequently, the amount of current that flows into the in-circuit diode 1 can be reduced significantly.

Figure 9:
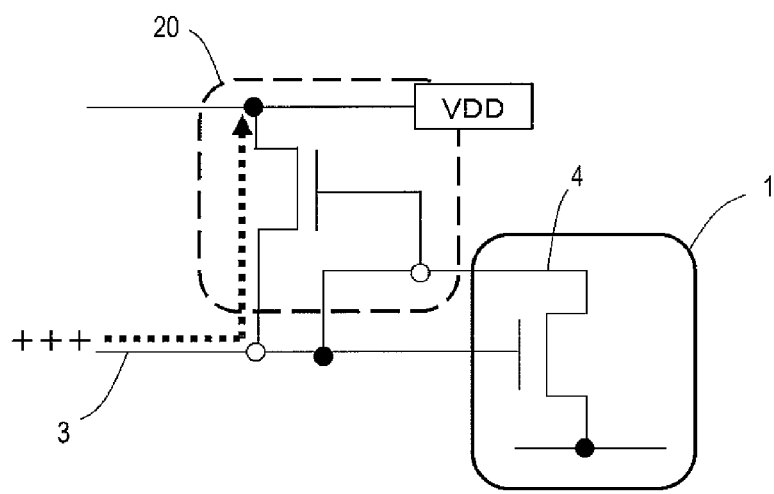
FIG. 9 illustrates a part of a circuit as Example #5 of the present invention.

On the other hand, in Example #5 of the present invention illustrated in FIG. 9, the gate electrode of the protection diode 20 is connected to the line 4 but the first electrode of the protection diode 20 is connected to the line 3. Even so, positive charges that have entered the circuit through the line 3 can be directed from the line 3 toward the VDD line as indicated by the dotted arrow.

As can be seen from these Examples #4 and #5, as long as the first and gate electrodes of the protection diode 20 are connected to one of the two lines 3 and 4, those electrodes are electrically connected to the gate electrode of the in-circuit diode 1. Consequently, the effects of Examples #1 to #3 can also be achieved in Examples #4 and #5.

Examples #6 to #12

Figure 10:
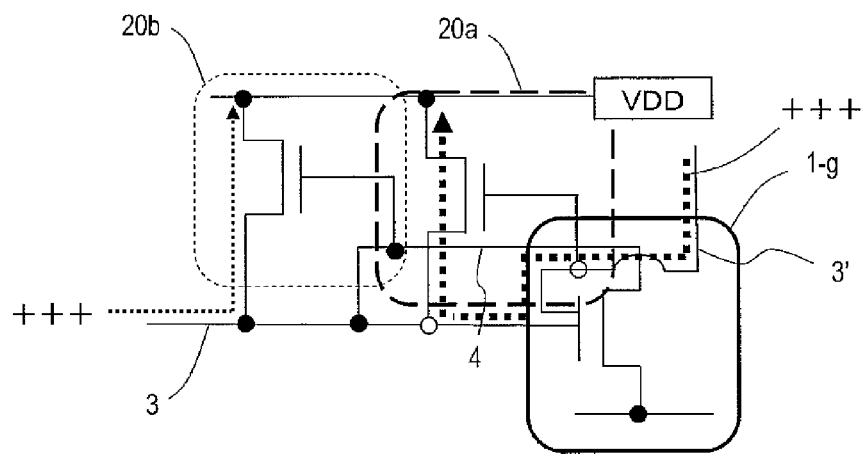
FIG. 10 illustrates a part of a circuit as Example #6 of the present invention, in which the gate electrode of its in-circuit diode is connected to multiple lines.
Figure 11:
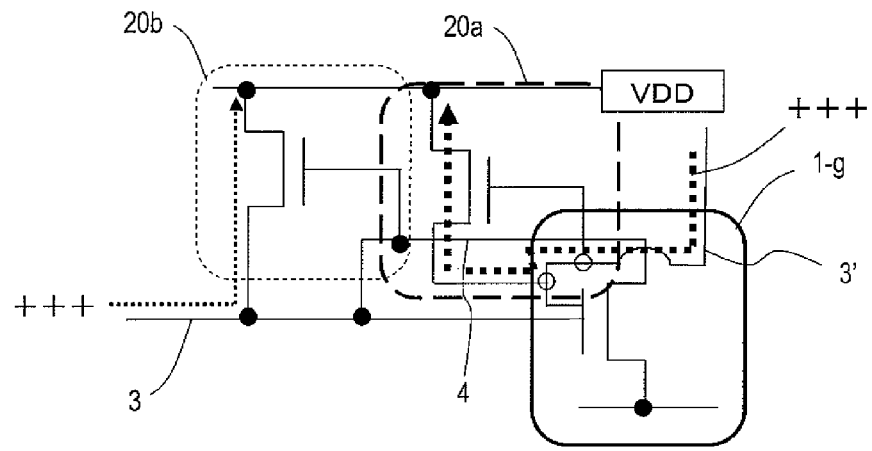
FIG. 11 illustrates a part of a circuit as Example #7 of the present invention, in which the gate electrode of its in-circuit diode is connected to multiple lines.
Figure 12:
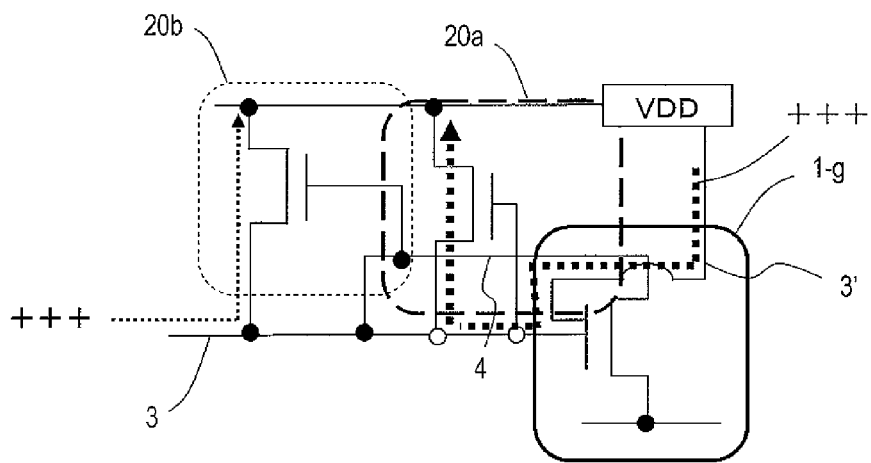
FIG. 12 illustrates a part of a circuit as Example #8 of the present invention, in which the gate electrode of its in-circuit diode is connected to multiple lines.
Figure 13:
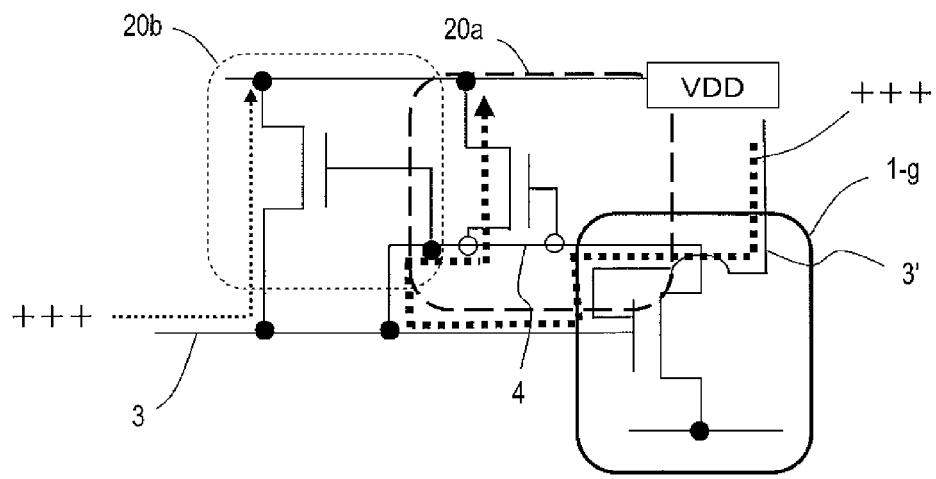
FIG. 13 illustrates a part of a circuit as Example #9 of the present invention, in which the gate electrode of its in-circuit diode is connected to multiple lines.
Figure 14:
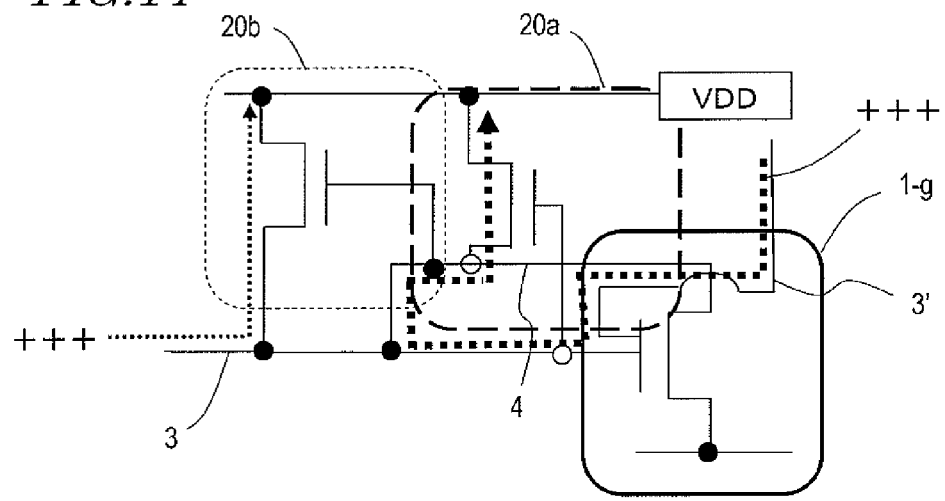
FIG. 14 illustrates a part of a circuit as Example #10 of the present invention, in which the gate electrode of its in-circuit diode is connected to multiple lines.
Figure 15:
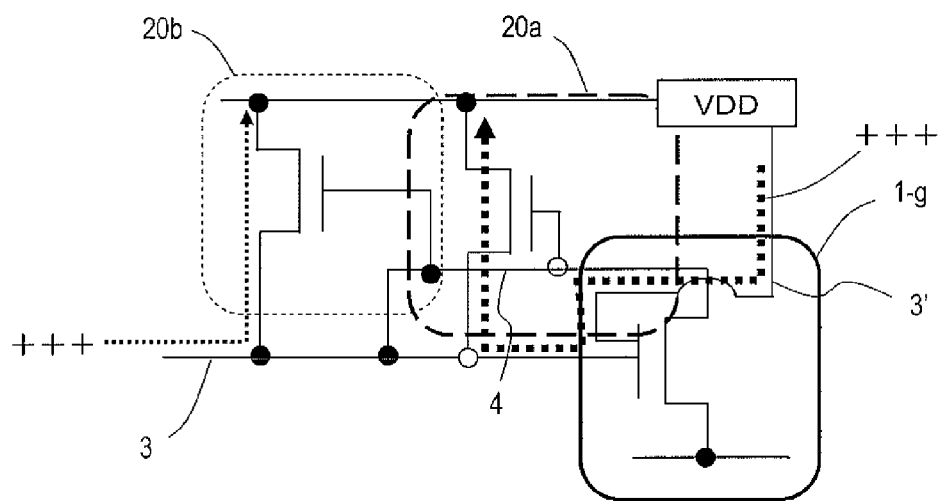
FIG. 15 illustrates a part of a circuit as Example #11 of the present invention, in which the gate electrode of its in-circuit diode is connected to multiple lines.

FIG. 10 illustrates a circuit representing Example #6 of the present invention, which includes an in-circuit diode 1-g and a protection circuit to protect the in-circuit diode 1-g. The gate electrode of the in-circuit diode 1-g is connected to two lines 3 and 3'. Such a structure with a gate electrode that is connected to two or more lines will be referred to herein as a "gate electrode branched structure". The protection circuit has at least two protection diodes, which include a protection diode 20a that protects the in-circuit diode 1-g from the static electricity entering the circuit through the line 3' and a protection diode 20b that protects the in-circuit diode 1-g from the static electricity entering the circuit through the line 3.

In this Example #6, if positive charges are applied onto the line 3', current flows from the line 3' toward the VDD line through the line 3 and the protection diode 20a. On the other hand, if positive charges are applied onto the line 3, then current flows through the VDD line by way of the protection diode 20b as already described with reference to FIGS. 5 through 9. Consequently, no matter through which of these two lines 3 and 3' that are connected to the gate electrode of the in-circuit diode 1-g the static electricity has entered the circuit, the in-circuit diode 1-g can always be protected.

FIGS. 11 through 15 illustrate Examples #7 through #11 of the present invention, each of which is another circuit including an in-circuit diode 1-g with such a gate electrode branched structure. In these Examples #7 through #11, the first and gate electrodes of the protection diodes 20a and 20b are connected to any of the lines 3, 3' and 4. The line 4 connects the first electrode of the in-circuit diode 1 to the line 3. According to any of these five examples, the effects of Example #6 can also be achieved.

Optionally, the gate electrode of the in-circuit diode 1-g may also be connected to three or more lines. In that case, to protect the in-circuit diode 1-g even more effectively, the protection diodes provided are preferably as many as the lines to which they are connected.

Nevertheless, an in-circuit diode 1-g with such a gate electrode branched structure could be protected with only one protection diode 20 as in Example #12 of the present invention.

Figure 16:
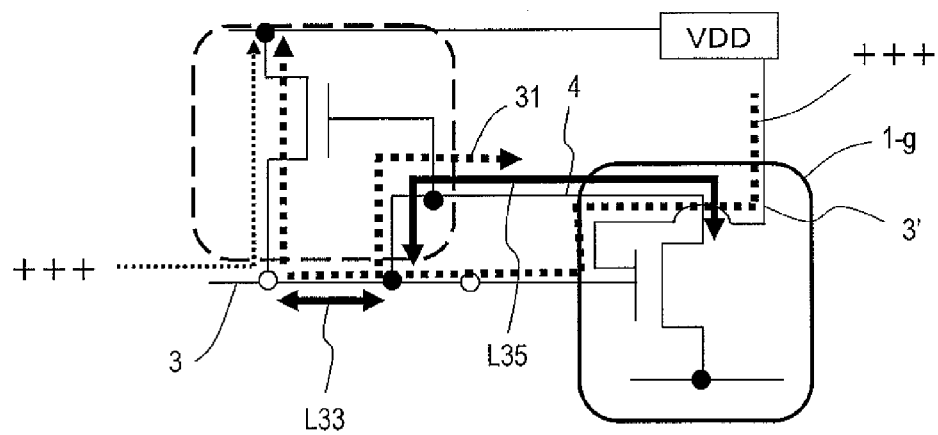
FIG. 16 illustrates a part of a circuit as Example #12 of the present invention, in which the gate electrode of its in-circuit diode is connected to multiple lines.

In the circuit shown in FIG. 16 representing Example #12 of the present invention, the length L33 of the line that runs from the connection point between the lines 3 and 4 (which will be referred to herein as a "branch point") through the protection diode 20 is shorter than the length L35 of the line that runs from the branch point through the first electrode of the in-circuit diode 1-g. In that case, the resistance becomes lower in the former portion between the branch point and the protection diode 20 than in the latter portion between the branch point and the first electrode of the in-circuit diode 1-g. That is why even if positive static electricity has been applied through the line 3', the current 31 is discharged by the protection diode 20 before reaching the first electrode of the in-circuit diode 1. Consequently, the protection circuit can prevent static electricity from destroying the in-circuit diode 1 even without providing an additional protection diode.

Examples #13 and #14

Figure 17:
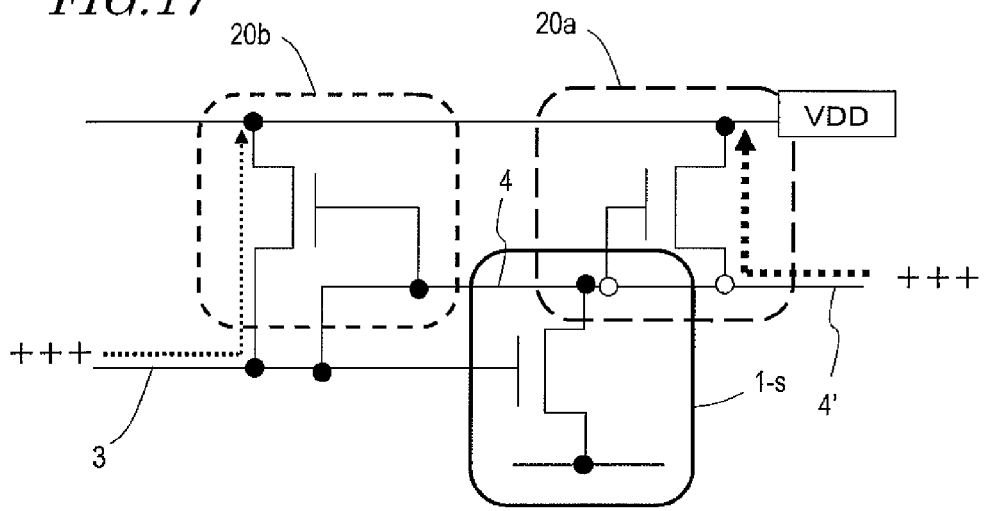
FIG. 17 illustrates a part of a circuit as Example #13 of the present invention, in which the first electrode (source electrode) of its in-circuit diode is connected to multiple lines.

FIG. 17 illustrates a circuit representing Example #13 of the present invention, which includes an in-circuit diode 1-s and a protection circuit to protect the in-circuit diode 1-s. The first electrode of the in-circuit diode 1-s is connected to two lines 4 and 4'. And the line 4 is connected to the line 3 that is connected to the gate electrode of the in-circuit diode 1-s. Such a structure with a first electrode that is connected to two or more lines will be referred to herein as a "first electrode branched structure". The protection circuit has at least two protection diodes, which include a protection diode 20a that protects the in-circuit diode 1-*s* from the static electricity entering the circuit through the line 4' and a protection diode 20*b* that protects the in-circuit diode 1-*s* from the static electricity entering the circuit through the line 3. In this example, the first and gate electrodes of the protection diode 20*a* are connected to the line 4', while the first and gate electrodes of the protection diode 20*b* are connected to one of the two lines 3 and 4.

In this Example #13, if positive charges are applied onto the line 4', current flows from the line 4' toward the VDD line through the protection diode 20*a*. On the other hand, if positive charges are applied onto the line 3, then current flows through the VDD line by way of the protection diode 20*b*. Consequently, no matter through which of these three lines 3, 4 and 4' that are connected to the first electrode of the in-circuit diode 1-*s* the static electricity has entered the circuit, the in-circuit diode 1-*s* can always be protected.

Figure 18:
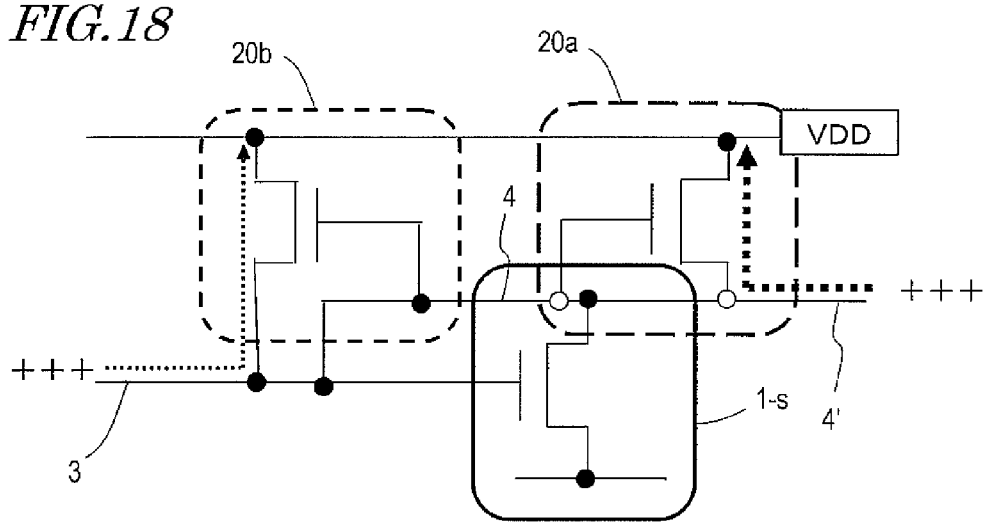
FIG. 18 illustrates a part of a circuit as Example #14 of the present invention, in which the first electrode (source electrode) of its in-circuit diode is connected to multiple lines.

FIG. 18 illustrates Example #14 of the present invention, which is another circuit including an in-circuit diode 1-*s* with the first electrode branched structure. In Example #14, the first electrode of the protection diode 20*a* is connected to the line 4' and the gate electrode thereof is connected to the line 4, which is a difference from Example #13 described above. Even in such an example, the positive charges that have entered the circuit through the line 4' can also be pushed away by the protection diode 20*a*. Consequently, the effects of Example #13 can also be achieved.

Example #15

The circuit representing Example #15 of the present invention has the same configuration as the circuit representing Example #1 of the present invention shown in FIG. 5 except that the in-circuit diode and protection diode are changed into their counterparts of P-channel type.

Figure 19:
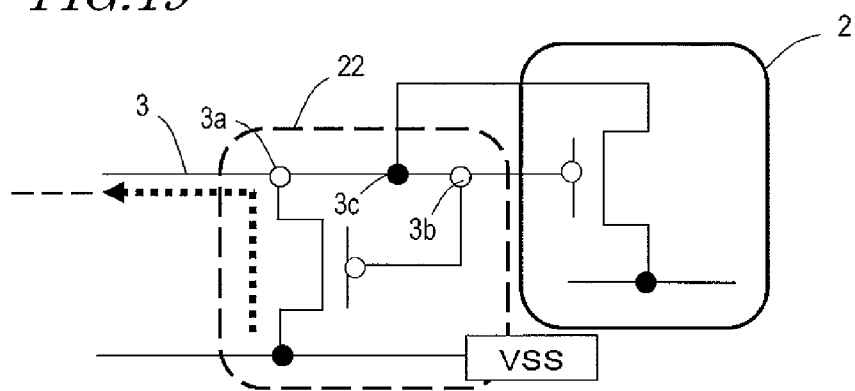
FIG. 19 illustrates a part of a circuit as Example #15 of the present invention, in which the conductivity type of its in-circuit diode is P type.

The circuit shown in FIG. 19 representing Example #15 of the present invention has a P-channel in-circuit diode 2 and a protection circuit with a protection diode 22 that protects the in-circuit diode 2. The protection diode 22 of this example is also a three-terminal diode of P-channel type. The first and gate electrodes of the protection diode 22 are connected to the line 3. Supposing the first electrode and gate electrode of the protection diode 22 are connected to the line 3 at connection points 3*a* and 3*b*, respectively, the first electrode of the in-circuit diode 2 is connected to the line 3 at a connection point 3*c* between those two connection points 3*a* and 3*b*. On the other hand, the second electrode of the protection diode 22 is connected to a VSS line.

According to this Example #15, when negative charges are applied onto the line 3, current flows from the VSS line toward the line 3 by way of the protection diode 22 as illustrated in FIG. 19. Consequently, the amount of current that flows between the first and second electrodes of the in-circuit diode 2 can be reduced significantly.

Although not shown, even in the other Examples #2 through #14 of the present invention shown in FIGS. 6 through 18 and described above, the conductivity type of the in-circuit diode and protection diode can also be changed into P-type in the same way.

<Configuration for Three-Terminal Diode>

Hereinafter, a specific configuration for a three-terminal diode, which is used as either an in-circuit diode or a protection diode, will be described for an N-channel diode as an example.

Figure 20:
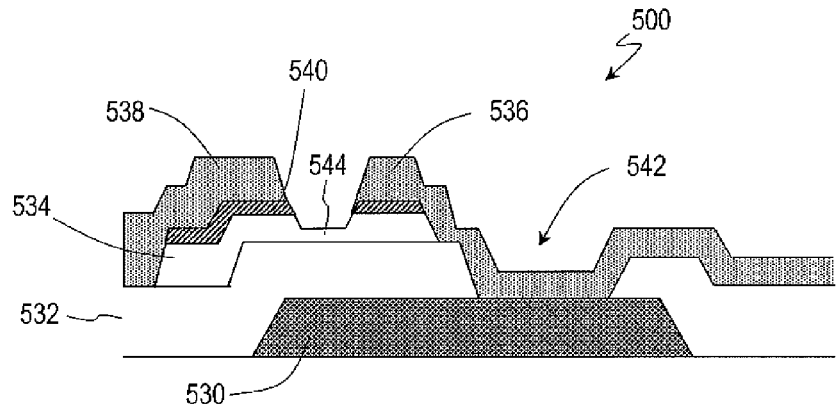
FIG. 20 is a schematic cross-sectional view illustrating an in-circuit diode according to the first preferred embodiment of the present invention.

FIG. 20 is a schematic cross-sectional view illustrating a three-terminal diode. The diode 500, which is an N-channel diode in this example, includes a gate electrode 530, a semiconductor layer 534 that has been stacked on the gate electrode 530 with a gate insulating film 532 interposed between them, and first and second electrodes 536 and 538 (which function as source and drain electrodes, respectively, and) which are electrically connected to the semiconductor layer 534 at both ends thereof. There is a contact layer 540 that is interposed between the semiconductor layer 534 and the first and second electrodes 536 and 538. The first electrode 536 is connected to the gate electrode 530 inside a contact hole 542. A channel region 544 of the semiconductor layer 534 that is located between the two electrodes 536 and 538 overlaps with the gate electrode 530. In this diode 500, current flows from the first electrode 536 into the second electrode 538 by way of the channel region 544 of the semiconductor layer 534.

The semiconductor layer 534 may be an amorphous silicon layer, a polycrystalline silicon layer, a microcrystalline silicon layer, or a metal oxide semiconductor layer (such as an IGZO layer), although not particularly limited to any of these layers. The microcrystalline silicon layer has a grain boundary including a number of columnar micro crystal grains and an amorphous phase. The amorphous phase may account for 5 to 40 vol % of the microcrystalline silicon layer. According to the Raman scattering spectroscopy, the peak height of the amorphous phase is one-third to one-tenth of that of the micro crystal grains. The metal oxide semiconductor layer may be a layer including a Zn—O based semiconductor (ZnO), an In—Ga—Zn—O based semiconductor (IGZO), an In—Zn—O based semiconductor (IZO) or a Zn—Ti—O based semiconductor (ZTO), for example.

If the diode 500 is used as the protection diode 20 shown in FIG. 5, then the first electrode (anode electrode) 536 of the diode 500 may be connected to the line 3 and the second electrode (cathode electrode) 538 thereof may be connected to a VDD line.

It should be noted that the protection diode included in the circuit of this preferred embodiment may be any diode as long as it is arranged to have a predetermined bias direction and does not have to be a three-terminal diode. Also, in Examples #1 through #15 of the present invention described above, the conductivity type of the protection diode 20 or 22 is supposed to be the same as that of the in-circuit diode 1 or 2. However, their conductivity types may be different from each other.

This preferred embodiment is effectively applicable to a circuit that includes, as in-circuit elements, a thin-film transistor and a thin-film diode. This is because the three-terminal in-circuit diode 1 or 2 of this preferred embodiment and a thin-film transistor can be fabricated by performing the same series of process steps. That is to say, the reason is that the manufacturing process can be simplified in that case. Particularly when a three-terminal diode is formed as the protection diode 20, the manufacturing process can be further simplified.

It is more preferred that this preferred embodiment be applied to a circuit with a single channel structure. In this description, the "circuit with a single channel structure" refers to a circuit, of which every thin-film transistor and every thin-film diode have the same conductivity type (i.e., either N type or P type).

(Embodiment 2)

Hereinafter, a second preferred embodiment of a semiconductor device according to the present invention will be described with reference to the accompanying drawings. The semiconductor device of this preferred embodiment is a shift register, which may be provided for an active-matrix substrate for a display device, for example.

Figure 21:
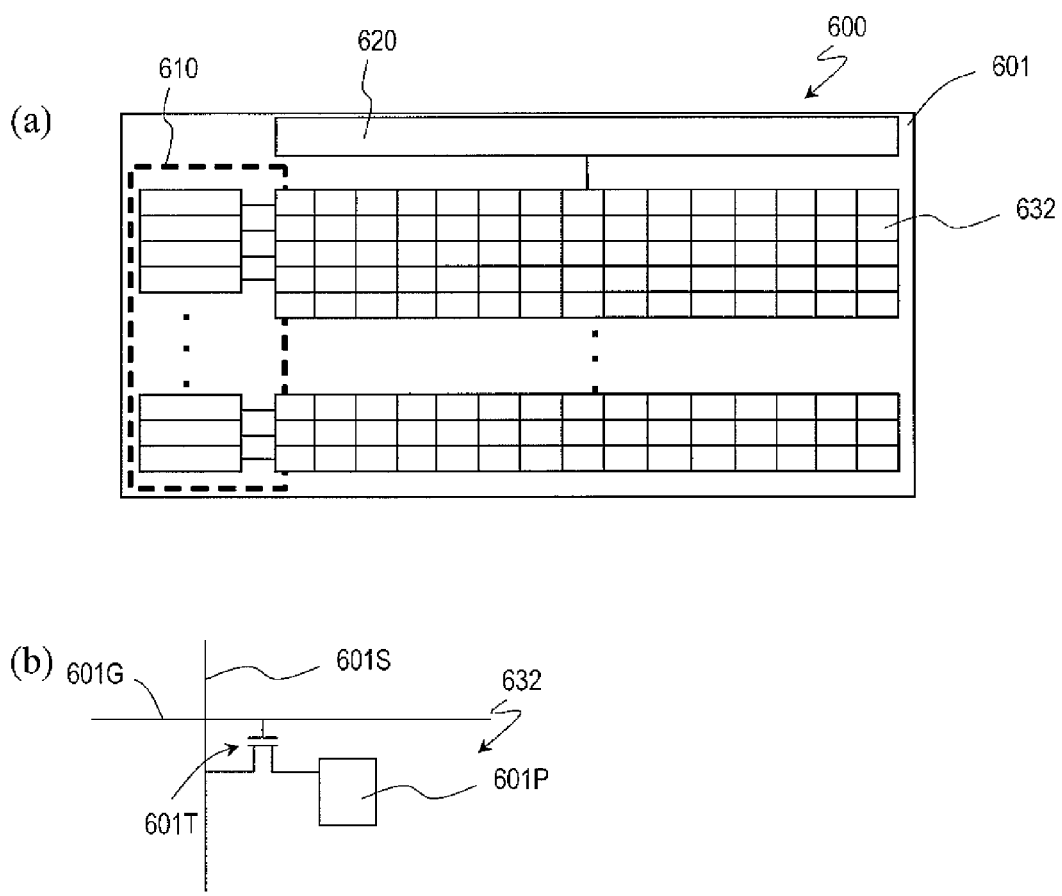

First of all, the structure of an active-matrix substrate will be described. FIG. 21(*a*) is a schematic plan view illustrating an active-matrix substrate 601 for a liquid crystal display (LCD) panel, while FIG. 21(*b*) schematically illustrates the structure of a single pixel thereof.

On the active-matrix substrate 601, a gate driver 610 and a source driver 620 have been integrated together. In the display area of the LCD panel 600, arranged are a number of pixels. In FIG. 21(*a*), one region of the active-matrix substrate 600 allocated to each pixel is identified by the reference numeral 632. It should be noted that the source driver 620 does not have to form an integral part of the active-matrix substrate 601. Alternatively, a source driver IC that has been fabricated separately may be combined with the active-matrix substrate 601 by a known method as well.

As shown in FIG. 21(*b*), the active-matrix substrate 601 includes a pixel electrode 601P, which is associated with one pixel of the LCD panel 600 and which is connected to a source bus line 601S via a pixel TFT 601T. The gate electrode of the TFT 601T is connected to a gate bus line 601G. Optionally, each pixel may have a pixel storage capacitor (not shown).

The gate bus line 601G is connected to the output of a gate driver 610 and is subjected to a line-sequential scan. The source bus line 601S is connected to the output of the source driver 620 and is supplied with a display signal voltage (gray-scale voltage).

Although not shown in FIG. 21(*b*), the gate driver 610 includes a shift register, which is supported on an insulating substrate such as a glass substrate that forms part of the active-matrix substrate 601. The shift register of this preferred embodiment includes a TFT and a TFD, which are three-terminal ones that have been fabricated along with the pixel TFTs 601T for the display area of the active-matrix substrate 601 by performing the same series of manufacturing process steps.

Figure 22:
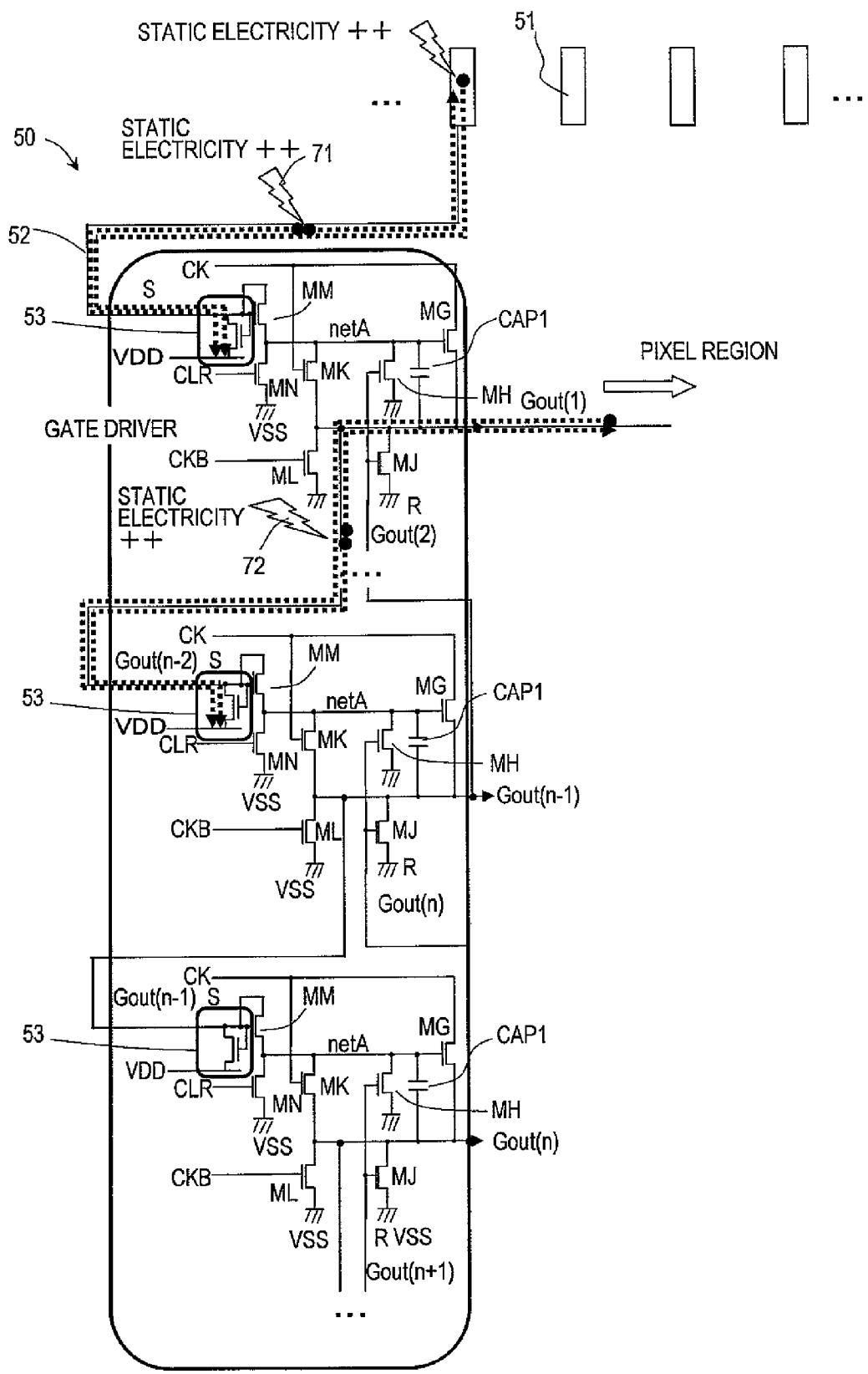
FIG. 22 illustrates an exemplary configuration for a shift register according to a second preferred embodiment of the present invention.

FIG. 22 illustrates an exemplary configuration for a shift register according to this preferred embodiment. The shift register 50 has multiple stages, only the first, $(n-1)^{th}$ and $n^{th}$ ones of which are illustrated schematically in FIG. 22. These multiple stages have substantially the same structure and are cascaded together. The output Gout of each stage of the shift register 50 is supplied to its associated gate bus line of the LCD panel.

The first stage of the shift register 50 is connected through an S signal input line 52 to an external connector pad 51. Thus, an S signal is input from the external connector pad 51 to the first stage. From the second stage on (e.g., on the $n^{th}$ stage), the output signal Gout of the previous stage (e.g., Gout (n−1)) is input as an S signal (e.g., Gout (n−1) S).

As shown in FIG. 22, each stage of the shift register 50 includes a three-terminal diode MM, which is connected to the S signal input line 52, a first type of transistor MG, which outputs an output signal Gout, and a second type of transistors MN, MK and MH, of which either the source region or drain region is electrically connected to the gate electrode of the first type of transistor MG. In this example, the first type of transistor MG is a so-called "pull-up transistor" and a line that is connected to the gate electrode of the first type of transistor MG is called "net A". The gate electrode and the first electrode of the diode MM are connected to the S signal input line 52 and the second electrode thereof is connected to net A. According to this preferred embodiment, the conductivity type of all of these diodes and transistors is N type.

A protection circuit 53 that protects the diode MM is provided for the S signal input line 52. The protection circuit 53 is arranged near the diode MM and includes a protection diode, of which the anode electrode is connected to the S signal input line 52 and the cathode electrode is connected to a VDD line. The protection diode of this preferred embodiment is an N-channel diode, of which the configuration has already been described with reference to FIG. 20. As already described with reference to FIGS. 5 through 9, the protection circuit 53 is arranged so that current flows from the S signal input line 52 to the VDD line.

Each stage supplies the output signal Gout onto its associated gate bus line only during a pixel write period. If attention is paid to one particular stage, this shift register is designed so that the potential of Gout is fixed at VSS most of one frame period, which is a period of time for selecting one gate bus line after another sequentially and which ends just before the same gate bus line is selected again.

The S signal, which is either the signal S supplied from the external connector pad 51 or the signal Gout (n−1) S supplied from the previous stage, is sent from the S signal input line 52 to net A by way of the diode MM to precharge net A. At this point in time, the transistors MN, MK an MH, of which the source or drain is connected to net A, are all in OFF state.

Next, when the clock signal CK is high, net A is pulled up. At that time, the output signal Gout (n) is supplied onto the gate bus line, thereby turning ON a pixel TFT that is connected to the gate bus line and applying a display signal voltage from the source bus line to the pixel electrode. That is to say, a liquid crystal capacitor, which is made up of a pixel electrode, a counter electrode (not shown) and a liquid crystal layer (not shown, either) interposed between those two electrodes, gets charged.

After that, the potential between net A and Gout is pulled down to VSS by supplying a reset signal R (i.e., the output signal Gout (n+1) of the next stage).

In this example, the capacitor CAP1 keeps the potential at net A and supplements the output. In response to the reset signal R, the transistor MJ makes the potential of the output signal Gout low. On the other hand, in response to the clock signal CKB, the transistor ML makes the potential of the output signal Gout low. A clear signal CLR is supplied once a frame (i.e., one vertical scanning period) to every stage of the shift register during one vertical retrace interval (i.e., the interval between the output of the last stage of the shift register and that of the first stage thereof), thereby making net A of every stage low. It should be noted that the clear signal CLR also functions as a reset signal for the last stage of the shift register.

Optionally, the shift register of this preferred embodiment may further include additional protection circuits for the input section and the output sections of the respective stages.

Figure 23:
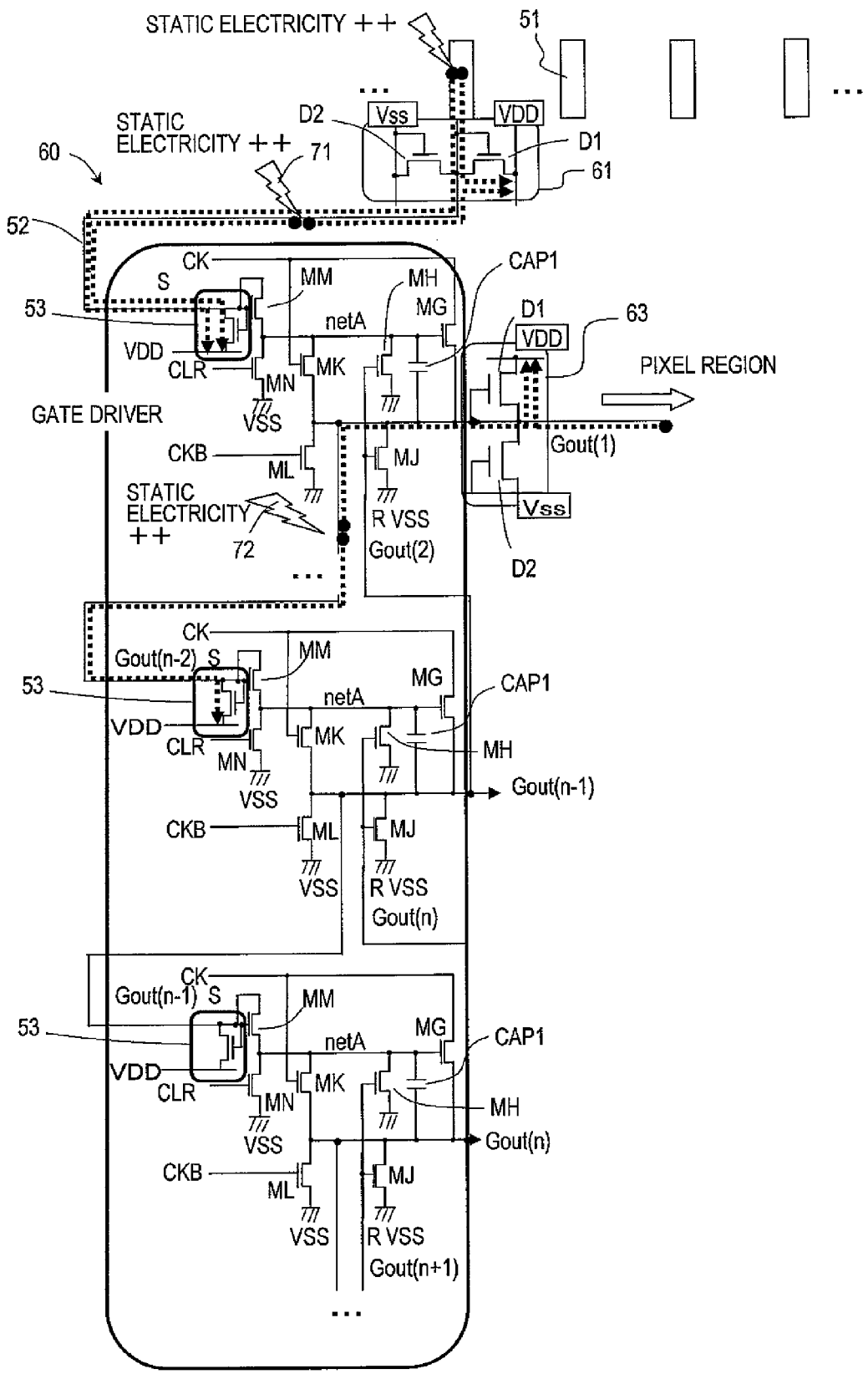
FIG. 23 illustrates an exemplary configuration for another shift register according to the second preferred embodiment of the present invention.

FIG. 23 illustrates an alternative configuration for the shift register of this preferred embodiment. In FIG. 23, any component also shown in FIG. 22 and having substantially the same function as its counterpart is identified by the same reference numeral and description thereof will be omitted herein.

The shift register 60 includes not only the protection circuit 53 but also a protection circuit 61 that is arranged near the external connector pad 51 and protection circuits 63 provided for the gate bus lines of the respective stages. In the other respects, the shift register 60 has the same configuration as the shift register 50 shown in FIG. 22.

Each of the protection circuits 61 and 63 includes two protection diodes D1 and D2 with mutually different bias directions. That is why if positive charges are applied from the external connector pad 51 to the S signal input line 52, current flows through the diode D1 of the protection circuit 61, thereby pushing the positive charges away to the VDD line. On the other hand, if negative charges are applied from the external connector pad 51, current flows through the diode D2 of the protection circuit 61, thereby pushing the negative charges away to the VSS line. Likewise, if positive charges are applied from a pixel region to a gate bus line, current flows through the diode D1 of the protection circuit 63. And if negative charges are applied thereto, then current flows through the diode D2 of the protection circuit 63. As a result, those charges can be pushed away to either the VDD line or the VSS line.

Each of the shift registers 50 and 60 shown in FIGS. 22 and 23 includes a protection circuit 53 for protecting the diode MM from ESD, and therefore, has the following advantages.

Figure 24:
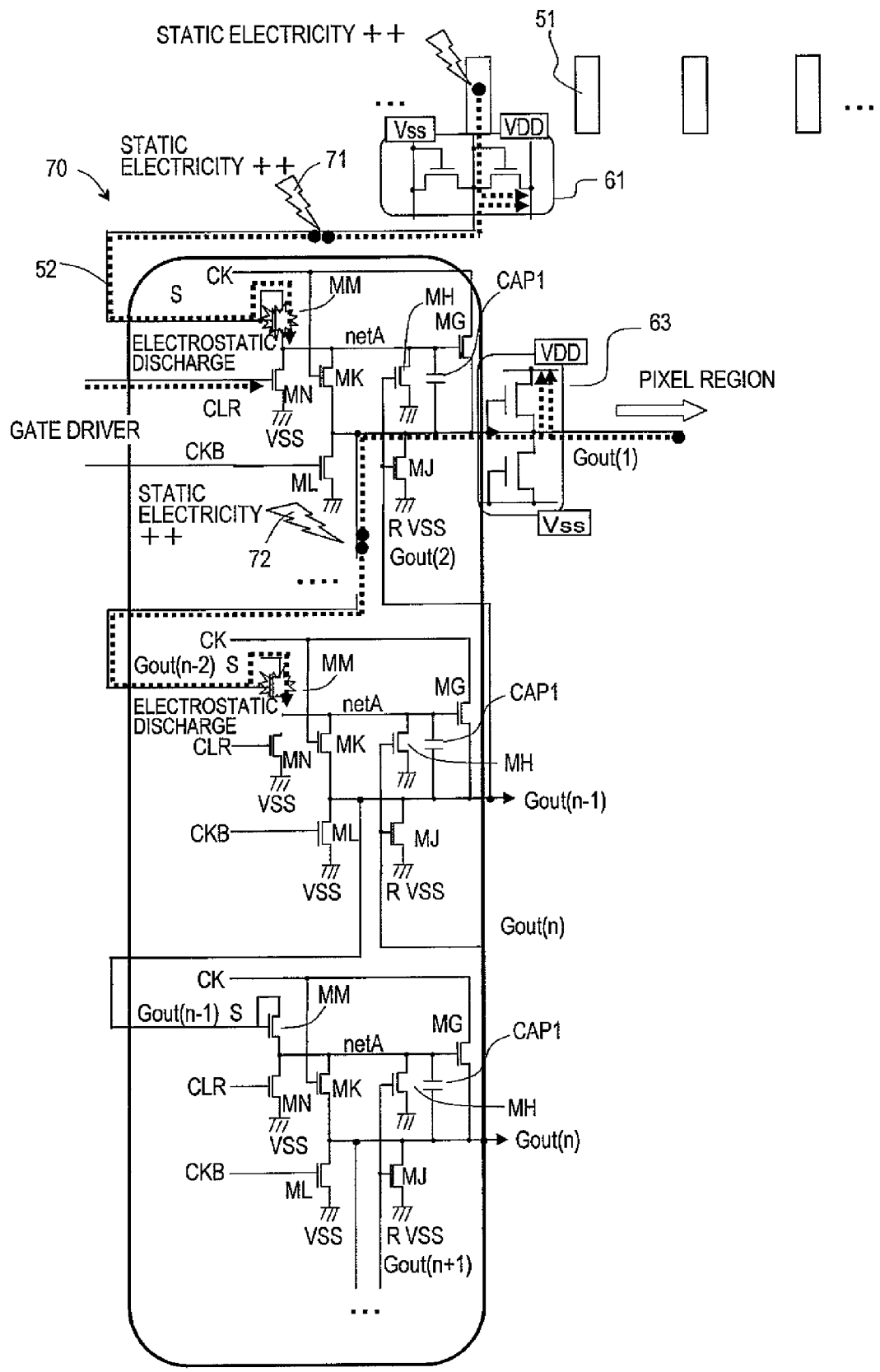
FIG. 24 illustrates an exemplary configuration for a shift register as a comparative example.

For the purpose of comparison, a shift register 70, which includes protection circuits 61 and 63 at only its input and output sections, is shown in FIG. 24. The shift register 70 has the same configuration as the shift register 60 shown in FIG. 23 except that the shift register 70 does not have the protection circuit 53 to protect the diode MM.

In the shift register 70, the protection circuit 61 can protect the in-circuit elements included in the first stage of the shift register 70 from the static electricity applied from the external connector pad 51 to the S signal input line 52. In the same way, the protection circuit 63 provided for the gate bus line for the $(n-1)^{th}$ stage can protect the in-circuit elements included in the next stage (i.e., the $n^{th}$ stage) of the shift register 70 from the static electricity applied externally (from a pixel region) to that gate bus line. However, since the line that runs from the protection circuit 61 or 63 through those in-circuit elements to protect (such as the diode MM and the transistor MN) is so long as to function as a sort of an antenna that attracts static electricity (as indicated by the arrow 71 or 72), a huge amount of current could still flow through the in-circuit elements to protect. For a final product, the static electricity coming from external input and output terminals could be a problem. During the manufacturing process, on the other hand, static electricity could be produced on the lines in the circuit as described above while a line is being formed by etching process, for example.

As already described with reference to FIGS. 1 and 2, the three-terminal diode MM would be particularly likely to have its performance deteriorated, or even be destroyed, by static electricity among various kinds of in-circuit elements. The present inventors carried out experiments to see how the diode MM and transistor MN of the shift register 70 would have their performance affected by static electricity. The results are as follows.

Figure 25:
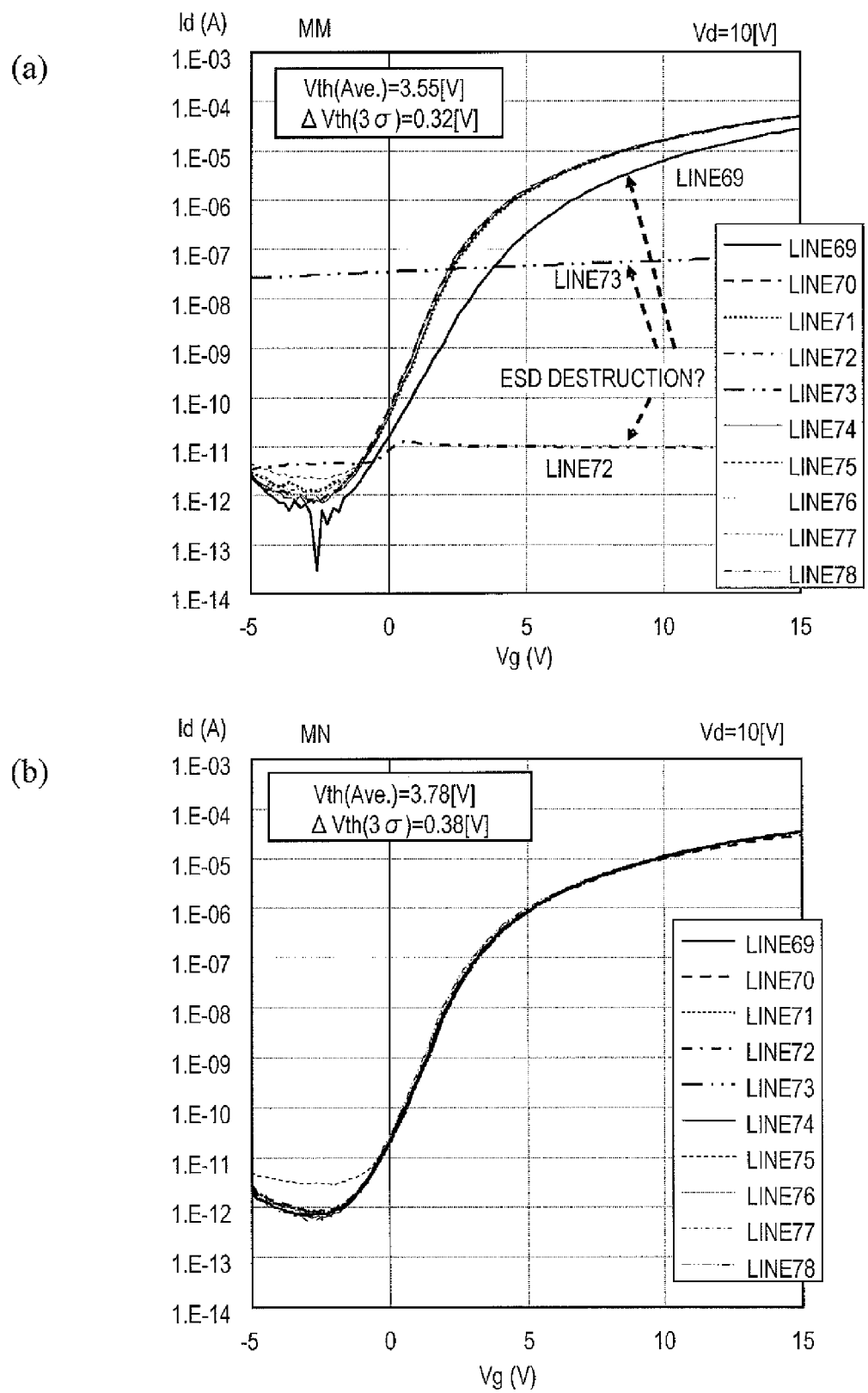
FIGS. 25(a) and 25(b) are graphs showing the voltage-current characteristics of a diode MM and a transistor MN in the shift register of the comparative example.

FIGS. 25(a) and 25(b) are graphs showing the voltage (Vg)-current (Id) characteristics of the diodes MM and transistors MH on the $69^{th}$ through $78^{th}$ stages (which are indicated by the curves LINE 69 through LINE 78) of the shift register 70 shown in FIG. 24. It should be noted that to compare their characteristics as TFT characteristics, measurements were made on the diodes after each of their electrode was separated so as to make a three-terminal measurement. In this case, the drain voltage Vd was set to be 10V.

As can be seen from FIG. 25(a), it was confirmed that three out of the ten diodes MM under measurement had had their characteristics deteriorated significantly. It should be noted that the other diodes MM, of which the characteristics did not particularly deteriorate, had an average threshold value Vth of 3.55 V and a variation Vth (3 σ) in threshold value of 0.32 V. The characteristics of those three diodes MM deteriorated probably because static electricity would have been produced on the line connecting the protection circuit 61 or 63 to the diode MM to protect and should have caused a large amount of current to flow through the diode MM. This result reveals that it is difficult to protect the diode MM perfectly with the protection circuit 61 or 63.

On the other hand, no deterioration in characteristic was seen at all on any of the transistors MN under measurement as shown in FIG. 25(b). Specifically, the transistors MN had an average threshold value Vth of 3.78 V and a variation Vth (3 σ) in threshold value of 0.38 V. As can be seen from this result, it was confirmed that even if static electricity externally entered a line for supplying the CLR signal, the transistors MN were hardly damaged.

On the other hand, in the shift register 50 or 60 of this preferred embodiment, the protection circuit 53 that protects the diode MM is arranged closer to the diode MM than the protection circuit 61 or 63 at the input or output section is. As can be seen, the length (e.g., 1 mm or less) of the line that runs from the protection diode of the protection circuit 53 through the diode MM is preferably much shorter than that (e.g., 10 mm) of the line that runs from the input or output section of the external connector pad 51 through the protection diode of the protection circuit 53. In that case, static electricity is much less likely to enter the line between the protection circuit 53 and the diode MM. As a result, the diode MM can be protected from static electricity more perfectly not only after the product is completed but also even during its manufacturing process. In the examples illustrated in FIGS. 22 and 23, the line running from the first electrode of the protection diode and the line running from the gate electrode are connected to the S signal input line 52 so as to interpose the connection point of the first electrode of the diode MM to the S signal input line 52 between them. And the length of the line between the protection circuit 53 and the diode MM is substantially equal to zero.

Thus, the protection circuit 53 of this preferred embodiment does not have to be arranged at the input or output section of a circuit as in the prior art but is preferably arranged closer to the diode to protect. That is why the protection circuit 53 does not have to be directly connected to the line running from the input or output section. Rather, another in-circuit element may even be provided between the input or output section and the protection circuit 53.

Nevertheless, the shift register of this preferred embodiment does not have to have the configuration shown in FIG. 22 or 23. Instead, this preferred embodiment is applicable to any of various other shift registers that include a thin-film diode as an in-circuit element.

Figure 26:
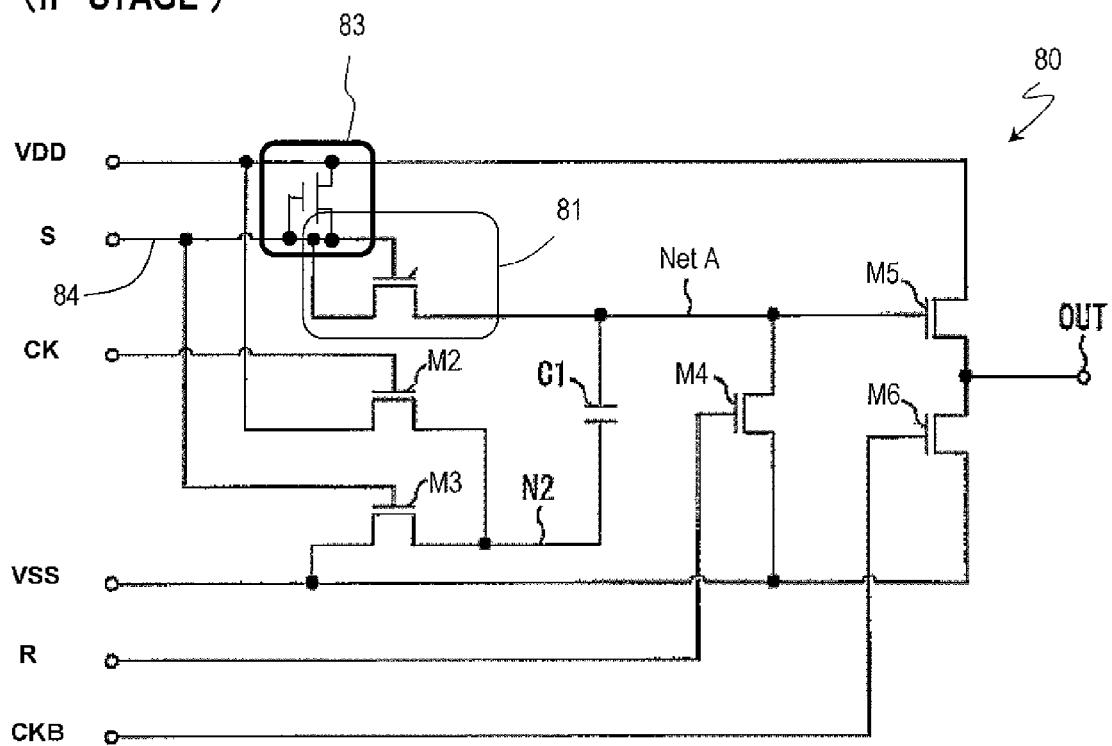
FIG. 26 illustrates an exemplary configuration for still another shift register according to the second preferred embodiment of the present invention.

FIG. 26 illustrates another shift register 80 according to this preferred embodiment. The shift register 80 has a number of stages, each of which has the configuration shown in FIG. 26.

Each stage of the shift register 80 includes a diode 81, which is arranged between an S signal input line 84 and a line net A, and a protection circuit 83 to protect the diode 81. The gate electrode and first electrode of the diode 81 are connected to the S signal input line 84, while the second electrode thereof is connected to the line net A. The protection circuit 83 includes a protection diode, of which the anode electrode is connected to the S signal input line 84 and the cathode electrode is connected to a VDD line. A first transistor M5 and a transistor M2 that is connected to a CK signal input line are also connected to a VDD line.

With such a configuration adopted, not just the effects that have already been described with reference to FIGS. 22 and 23 but also the following effects can be achieved.

According to the configurations shown in FIGS. 22 and 23, in order to provide the protection circuit 53, a VDD line that is not connected to any in-circuit element of the shift register should be extended, thus possibly increasing the circuit size. On the other hand, according to the configuration shown in FIG. 26, at least one in-circuit element is connected to the VDD line on each stage of the shift register. That is why there is no need to extend the VDD line in order to provide the protection circuit 83. Consequently, such an increase in circuit size can be checked even more effectively.

In the shift registers 50, 60 and 80 described above, each of the transistors of the second type has a single channel structure. However, the transistor may also have a multi-channel structure (such as a dual-core channel structure) instead. Particularly when the transistors of the second type are formed by patterning a microcrystalline silicon layer, those transistors preferably have a multi-channel structure. The reason will be described below.

Specifically, if the net A has its voltage pulled up, a great voltage Vds is applied to between the source and drain of each transistor of the second type in OFF state, of which the source or drain is connected to the net A. In that case, the pulled up voltage of the net A decreases earlier than when it should do in response to the clock signal CK (low) due to the leakage current flowing through the second type of transistor, of which the source or drain is connected to the net A. And if the voltage of the net A decreases, the output voltage Gout does not become high or comes to have a waveform with blunted edges. As a result, a sufficiently high voltage cannot be applied to the pixel electrodes and the display quality eventually declines.

If a shift register is formed of microcrystalline silicon TFTs with a single channel structure, then chances are those failures are caused by the leakage current because those TFTs will have a relatively large amount of leakage current. On the other hand, a microcrystalline silicon TFT with a multi-channel structure will have a smaller amount of leakage current in the sub-threshold region than a microcrystalline silicon TFT with the single channel structure. As a result, the decrease in voltage at the net A and waveform blunting of the output signal Gout can be lessened. It should be noted that if a dual channel structure is introduced to at least one TFT out of multiple transistors of the second type, the leakage current can be reduced as for that transistor to say the least.

(Embodiment 3)

Hereinafter, a third preferred embodiment of a semiconductor device according to the present invention will be described with reference to the accompanying drawings. In the example to be described below with reference to FIGS. 27 through 32, the protection circuit of the present invention is supposed to be applied to a circuit other than a shift register. The protection circuit of this preferred embodiment has the same configuration and same arrangement (or bias direction) as its counterpart of the first or second preferred embodiment described above. In some of those drawings, it is indicated only where the protection circuit should be arranged and the illustration of the protection circuit itself is omitted.

Figure 27:
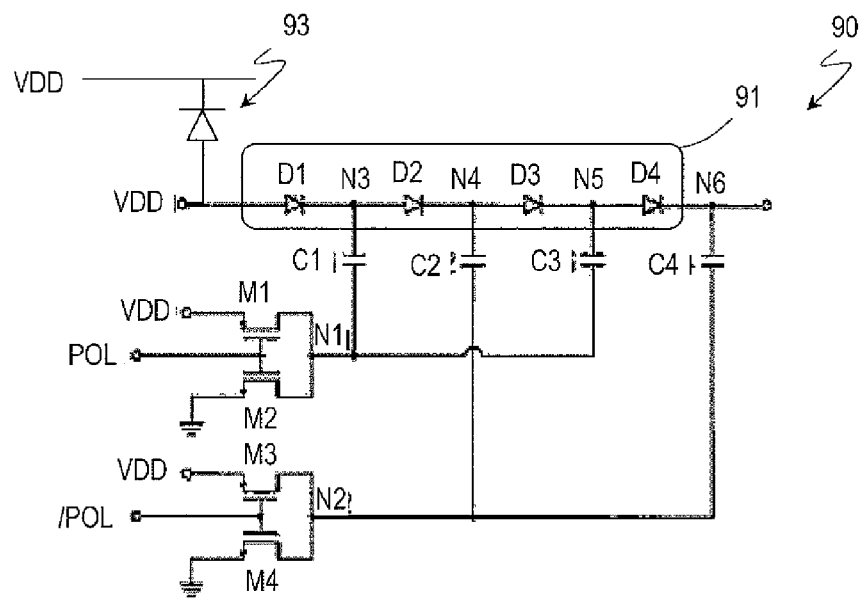
FIG. 27 illustrates a configuration for a circuit according to a third preferred embodiment of the present invention.

FIG. 27 illustrates a gate ON voltage generator 90 as an example. In this example, a protection circuit 93 to protect an in-circuit diode 91 is added to the conventional gate ON voltage generator (disclosed in Japanese Patent Application Laid-Open Publication No. 8-262407, for example).

Figure 28:
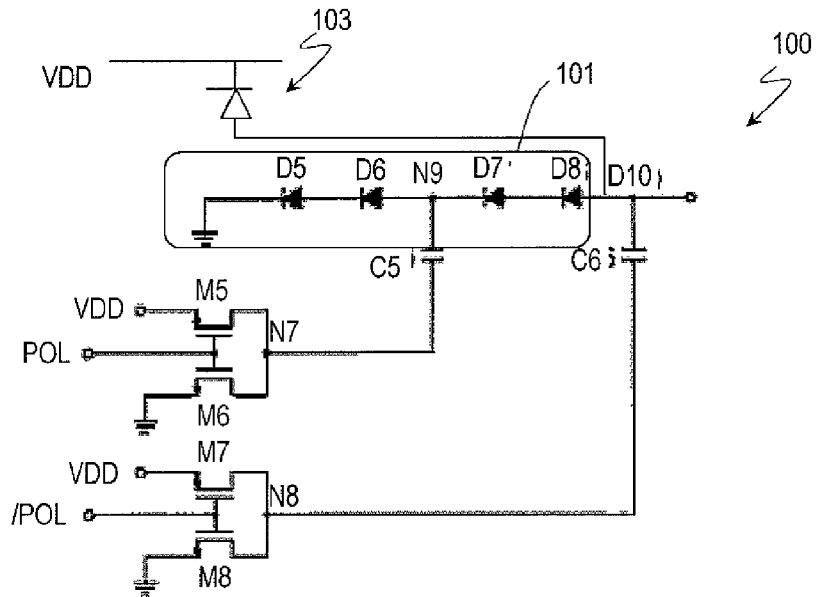
FIG. 28 illustrates a configuration for another circuit according to the third preferred embodiment of the present invention.

FIG. 28 illustrates a gate OFF voltage generator 100 as an example. In this example, a protection circuit 103 to protect an in-circuit diode 101 is added to the conventional gate OFF voltage generator (also disclosed in Japanese Patent Application Laid-Open Publication No. 8-262407, for example).

Figure 29:
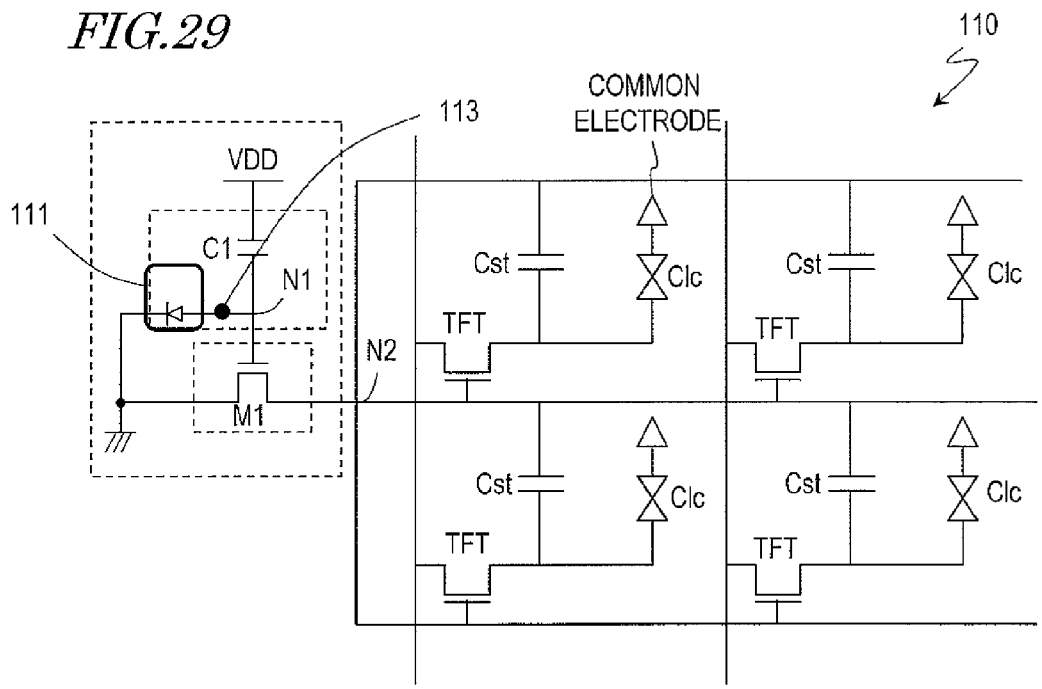
FIG. 29 illustrates a configuration for still another circuit according to the third preferred embodiment of the present invention.

FIG. 29 illustrates a screen eraser 110. In this example, a protection circuit 113 to protect an in-circuit diode 111 is added to the conventional screen eraser (disclosed in Japanese Patent Application Laid-Open Publication No. 9-127486, for example).

Figure 30:
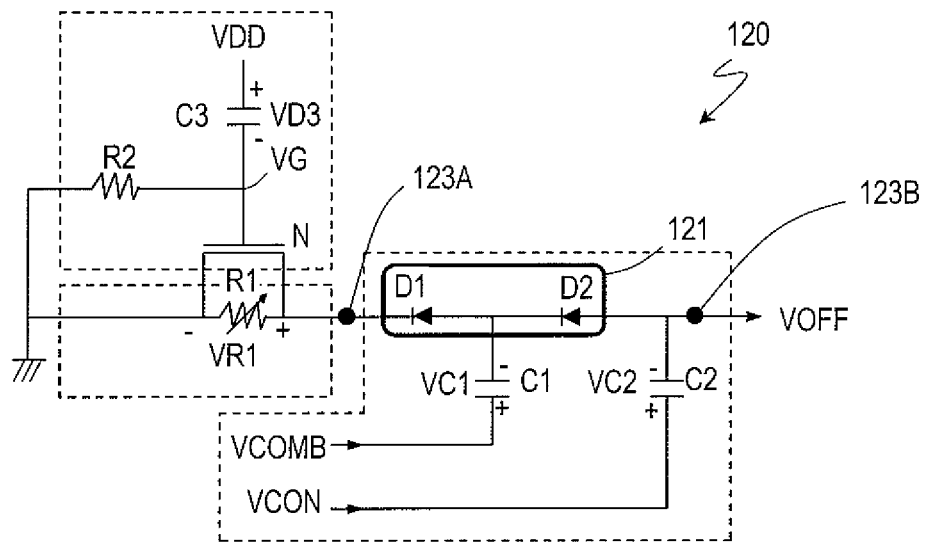
FIG. 30 illustrates a configuration for yet another circuit according to the third preferred embodiment of the present invention.

FIG. 30 illustrates an OFF voltage generator 120. In this example, protection circuits 123A and 123B to protect an in-circuit diode 121 are added to the conventional OFF voltage generator (disclosed in Japanese Patent Application Laid-Open Publication No. 9-222591, for example). In this example, two protection circuits 123A and 123B are arranged on both of the input and output sides of the in-circuit diode 121. However, the protection circuit may also be arranged on only one of the input and output sides of the in-circuit diode 121.

Figure 31:
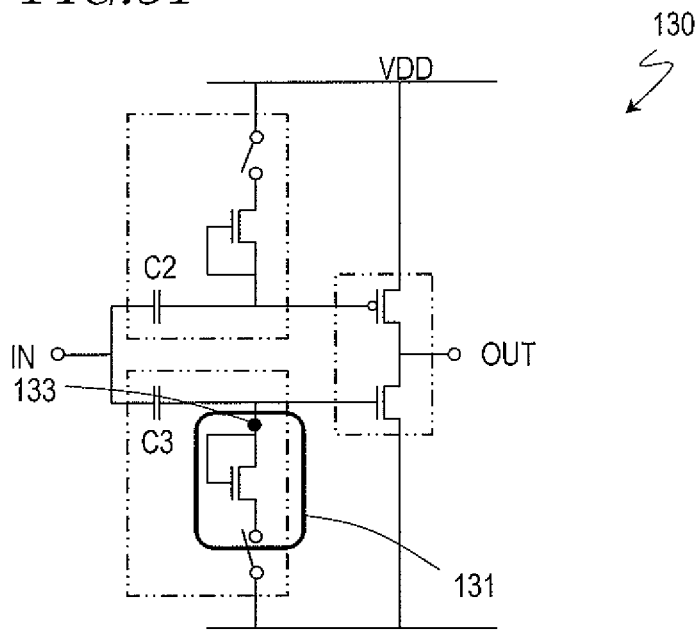
FIG. 31 illustrates a configuration for yet another circuit according to the third preferred embodiment of the present invention.

FIG. 31 illustrates an input signal corrector 130. In this example, a protection circuit 133 to protect an in-circuit diode 131 is added to the conventional input signal corrector (disclosed in Japanese Patent Application Laid-Open Publication No. 2007-82239, for example).

Figure 32:
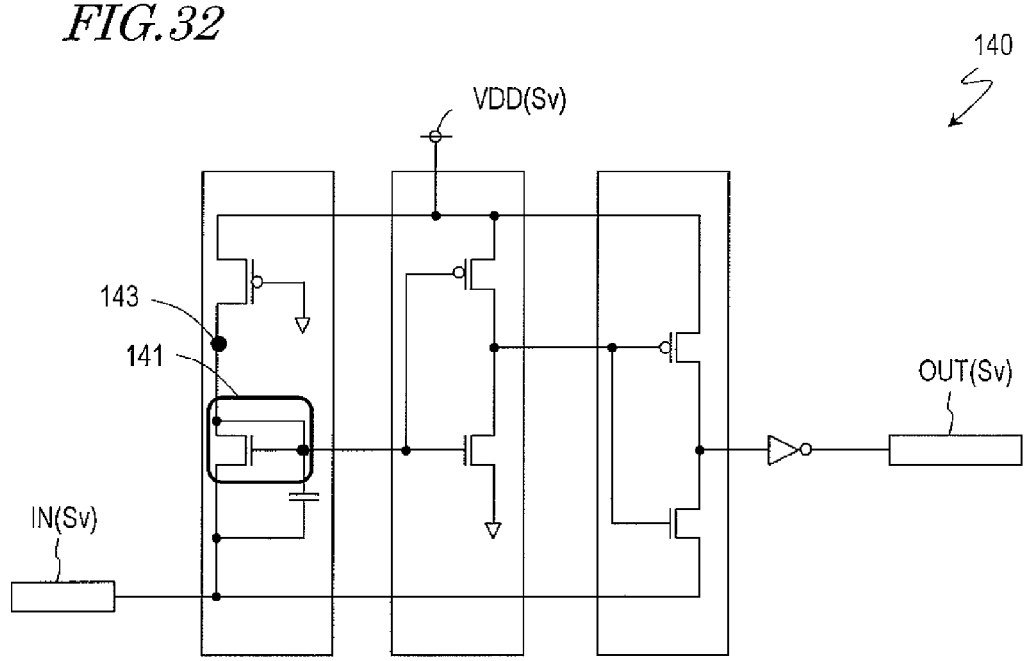
FIG. 32 illustrates a configuration for yet another circuit according to the third preferred embodiment of the present invention.

FIG. 32 illustrates a level shifter 140. In this example, a protection circuit 143 to protect an in-circuit diode 141 is added to the conventional level shifter (disclosed in Japanese Patent Application Laid-Open Publication No. 2008-22539, for example).

As can be seen, the protection circuit of this preferred embodiment is applicable to various circuits with an in-circuit diode, and the effects of the preferred embodiments described above are also achieved in any of those cases. In addition, as in the examples illustrated in FIGS. 27 to 32, the present invention is applicable to not just the in-circuit diode but also a circuit with a VDD line as well. This is because as there is no need to extend the VDD line in order to provide a protection circuit, the protection circuit can be added without increasing the overall circuit size.

It should be noted that the protection diode of the present invention does refer to a diode that is included in a protection circuit in order to protect an in-circuit diode but does not refer to a diode that protects a protection diode. Such a diode that protects a protection diode is disclosed in Japanese Patent Application Laid-Open Publication No. 3-206666, for example.

Figure 33:
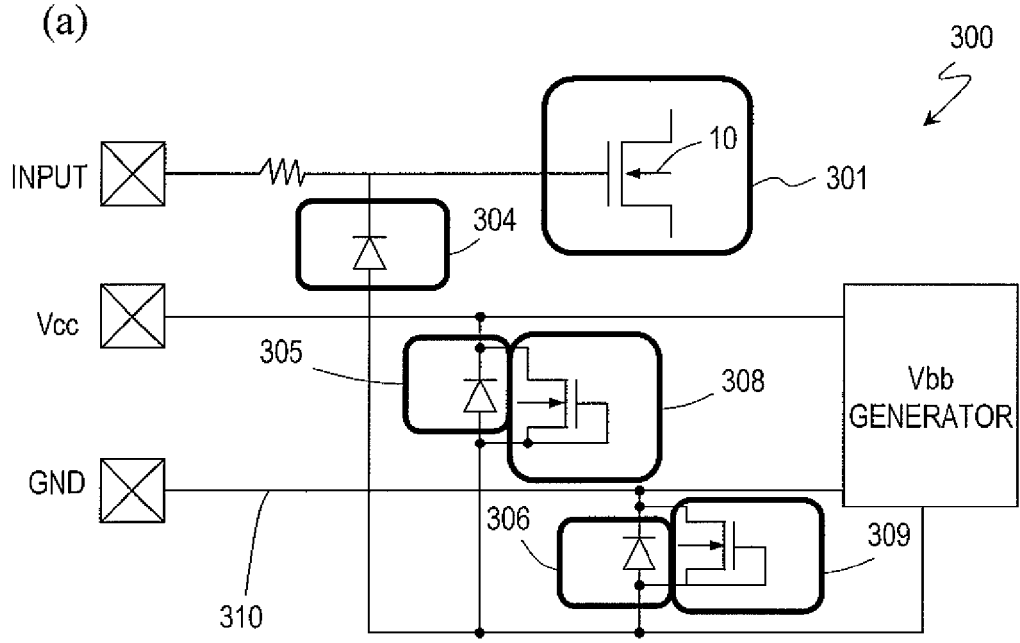
FIG. 33(a) illustrates a conventional circuit with an ESD protection circuit and FIG. 33(b) illustrates a part of the circuit shown in FIG. 33(a).
Figure 33:
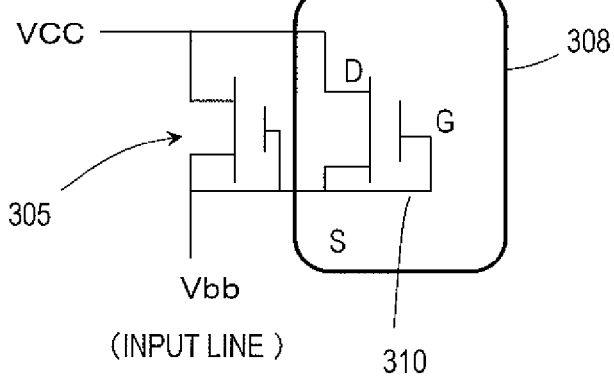

FIG. 33(*a*) illustrates a circuit 300 as disclosed in Japanese Patent Application Laid-Open Publication No. 3-206666, while FIG. 32(*b*) is a partially enlarged view of the circuit 300. The circuit 300 includes parasitic diodes 304, 305 and 306 that protect a thin-film transistor 10. Also, protection diodes 308 and 309 that protect the parasitic diodes 305 and 306 and the protection diodes 305 and 306 are connected in parallel together.

In the circuit 300, the protection diodes 308 and 309 are provided in order to protect the protection diodes (parasitic diodes) 305 and 306, not an in-circuit diode (i.e., a diode that forms a major part of a circuit). The protection diode 308 and the parasitic diode 305 are connected in parallel together. That is why when the parasitic diode 305 turns ON upon the application of a voltage, the protection diode 308 also turns ON and current flows. In this manner, the parasitic diode 305 and the protection diode 308 turn ON simultaneously and both of their output currents flow through the same line (i.e., a VCC line). Since the parasitic diode 305 does not form a major part of the circuit 300, there is no problem even if the parasitic diode 305 and the protection diode 308 are connected to the same line. However, if the parasitic diode 305 were an in-circuit diode, the protection diode 308 could cause the circuit to operate erroneously. This is because as the in-circuit diode and the protection diode are connected in parallel together, it is impossible to turn only the in-circuit diode ON and the output currents of both the in-circuit diode and the protection diode will flow through the same output line.

Figure 34:
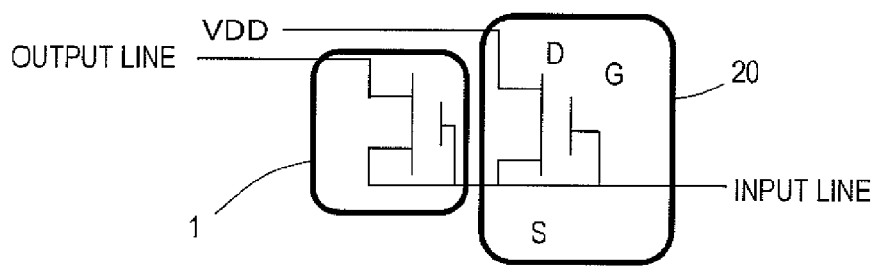
FIG. 34 illustrates how a protection circuit according to the present invention works.

On the other hand, according to the present invention, the diode to protect is an in-circuit diode. As shown in FIG. 34, the in-circuit diode 1 to protect and the protection diode 200 are connected to two different output lines. That is why even if the in-circuit diode 1 turns ON upon the application of the best voltage, the protection diode 20 does not turn ON. Consequently, the protection diode 20 does not affect the amount of current flowing through the output line of the in-circuit diode 1, and therefore, will never cause the circuit to operate erroneously.

INDUSTRIAL APPLICABILITY

The present invention is broadly applicable for use in any of various kinds of semiconductor devices that ever has a circuit fabricated on an insulating substrate. And the present invention can be used in any device with a thin-film transistor. Examples of such semiconductor devices include circuit boards such as an active-matrix substrate, display devices such as a liquid crystal display, an organic electroluminescence (EL) display, and an inorganic electroluminescence display, image capture devices such as a flatpanel X-ray image sensor, and electronics such as an image input device and a fingerprint scanner. Among other things, the present invention will be particularly effectively applicable to a liquid crystal display device that realizes excellent display quality by being driven faster than a normal one, a liquid crystal display device with low power dissipation, or a liquid crystal display device with a bigger monitor screen.

REFERENCE SIGNS LIST

D1, D2 protection diode
20 protection diode (of N-channel type)
22 protection diode (of P-channel type)
MM in-circuit diode
1 in-circuit diode (of N-channel type)
2 in-circuit diode (of P-channel type)
3, 8, 9 line
MK, MH, MJ, ML, MN thin-film transistor
50, 60, 70, 80 shift register
52 S signal input line
53 protection circuit
61, 63 protection circuit

The invention claimed is:

1. A semiconductor device comprising a circuit that has been formed on a substrate and that includes a thin-film diode and a protection circuit for protecting the thin-film diode, the protection circuit having a protection diode,
wherein the thin-film diode is an in-circuit diode that is indispensable to allow the circuit to perform its intended function, and
wherein the thin-film diode comprises:
at least one semiconductor layer, which is arranged on the substrate and which has a first region, a second region and a channel region that is located between the first and second regions;
a gate electrode, which is arranged so as to overlap with the channel region;
a gate insulating layer, which is arranged between the gate electrode and the semiconductor layer;
a first electrode, which is arranged on the first region and which is electrically connected to the first region and the gate electrode; and
a second electrode, which is arranged on, and electrically connected to, the second region,
wherein (a) the conductivity type of the thin-film diode is N-type, the anode electrode of the protection diode is connected to a line that is connected to either the gate electrode or the first electrode of the thin-film diode, and the protection circuit includes no other diodes that have a cathode electrode connected to the line,
wherein (b) the conductivity type of the thin-film diode is P-type, the cathode electrode of the protection diode is connected to the line that is connected to either the gate electrode or the first electrode of the thin-film diode, and the protection circuit includes no other diodes that have an anode electrode connected to the line, and
wherein the protection diode and the thin-film diode are not connected in parallel.

2. A semiconductor device comprising a circuit that has been formed on a substrate and that includes a thin-film diode and a protection circuit for protecting the thin-film diode,
wherein the circuit has a signal input line, through which a signal is input from outside, and the thin-film diode and the protection circuit are connected to the signal input line,
wherein the protection circuit having a protection diode,
wherein the thin-film diode comprises:
at least one semiconductor layer, which is arranged on the substrate and which has a first region, a second region and a channel region that is located between the first and second regions;
a gate electrode, which is arranged so as to overlap with the channel region;
a gate insulating layer, which is arranged between the gate electrode and the semiconductor layer;
a first electrode, which is arranged on the first region and which is electrically connected to the first region and the gate electrode; and
a second electrode, which is arranged on, and electrically connected to, the second region,
wherein (a) the conductivity type of the thin-film diode is N-type, the anode electrode of the protection diode is connected to a line that is connected to either the gate electrode or the first electrode of the thin-film diode, and the protection circuit includes no other diodes that have a cathode electrode connected to the line,
wherein (b) the conductivity type of the thin-film diode is P-type, the cathode electrode of the protection diode is connected to the line that is connected to either the gate electrode or the first electrode of the thin-film diode, and the protection circuit includes no other diodes that have an anode electrode connected to the line, and
wherein the protection diode and the thin-film diode are not connected in parallel.

3. A semiconductor device comprising a circuit that has been formed on a substrate and that includes a thin-film diode and a protection circuit for protecting the thin-film diode,
wherein the circuit includes a shift resistor, the shift register has a plurality of stages, each of the plurality of stages has the thin-film diode and the protection circuit,
wherein, in the each of the plurality of stages, the thin-film diode and the protection circuit are connected to a signal input line, through which a signal is input from outside or a previous stage,
wherein the protection circuit having a protection diode,
wherein the thin-film diode comprises:
at least one semiconductor layer, which is arranged on the substrate and which has a first region, a second region and a channel region that is located between the first and second regions;

a gate electrode, which is arranged so as to overlap with the channel region;

a gate insulating layer, which is arranged between the gate electrode and the semiconductor layer;

a first electrode, which is arranged on the first region and which is electrically connected to the first region and the gate electrode; and a second electrode, which is arranged on, and electrically connected to, the second region, and wherein (a) the conductivity type of the thin-film diode is N-type, the anode electrode of the protection diode is connected to a line that is connected to either the gate electrode or the first electrode of the thin-film diode, and the protection circuit includes no other diodes that have a cathode electrode connected to the line, wherein (b) the conductivity type of the thin-film diode is P-type, the cathode electrode of the protection diode is connected to the line that is connected to either the gate electrode or the first electrode of the thin-film diode, and the protection circuit includes no other diodes that have an anode electrode connected to the line, and wherein the protection diode and the thin-film diode are not connected in parallel.

4. The semiconductor device of claim 1, wherein the protection diode comprises:

at least one semiconductor layer, which is arranged on the substrate and which has a first region, a second region and a channel region that is located between the first and second regions;

a gate electrode, which is arranged so as to overlap with the channel region;

a gate insulating layer, which is arranged between the gate electrode and the semiconductor layer;

a first electrode, which is arranged on the first region and which is electrically connected to the first region and the gate electrode; and a second electrode, which is arranged on, and electrically connected to, the second region.

5. The semiconductor device of claim 4, wherein the respective semiconductor layers of the thin-film diode and the protection diode are made of the same semiconductor film.

6. The semiconductor device of claim 1, further comprising multiple thin-film transistors, wherein the thin-film transistors have the same conductivity type as the thin-film diode, and wherein the respective semiconductor layers of the thin-film transistors and the thin-film diode are made of the same semiconductor film.

7. The semiconductor device of claim 6, wherein no protection circuits are provided for the line that is connected to the gate electrode of each said thin-film transistor.

8. The semiconductor device of claim 1, wherein the circuit includes either an input section for inputting a signal from an external device to the circuit or an output section for outputting a signal from the circuit to an external device, and wherein a line that connects the thin-film diode and the protection diode together has a shorter length than a line that connects the input or output section to the protection diode together.

9. The semiconductor device of claim 8, wherein the line that connects the thin-film diode and the protection diode together has a length of 1 mm or less.

10. The semiconductor device of claim 1, wherein (a) the conductivity type of the thin-film diode is N-type and the anode electrode of the protection diode is connected to the line that is connected to either the gate electrode or the first electrode of the thin-film diode, and wherein when the anode electrode of the protection diode is high, the cathode electrode of the protection diode is also high.

11. The semiconductor device of claim 1, wherein (a) the conductivity type of the thin-film diode is N-type and the anode electrode of the protection diode is connected to the line that is connected to either the gate electrode or the first electrode of the thin-film diode, and wherein the cathode electrode of the protection diode is connected to a line leading to a VDD power supply.

12. The semiconductor device of claim 1, wherein (b) the conductivity type of the thin-film diode is P-type and the cathode electrode of the protection diode is connected to the line that is connected to either the gate electrode or the first electrode of the thin-film diode, and wherein when the cathode electrode of the protection diode IS low, the anode electrode of the protection diode is also low.

13. The semiconductor device of claim 1, wherein (b) the conductivity type of the thin-film diode is P-type and the cathode electrode of the protection diode is connected to the line that is connected to either the gate electrode or the first electrode of the thin-film diode, and wherein the anode electrode of the protection diode is connected to a line leading to a VSS power supply.

14. The semiconductor device of claim 1, wherein the at least one semiconductor layer of the thin-film diode is an oxide semiconductor layer.

15. The semiconductor device of claim 14, wherein the at least one semiconductor layer of the thin-film diode includes In—Ga—Zn—O based semiconductor.

16. The semiconductor device of claim 4, wherein the at least one semiconductor layer of the protection diode is an oxide semiconductor layer.

17. The semiconductor device of claim 16, wherein the at least one semiconductor layer of the protection diode includes In—Ga—Zn—O based semiconductor.

18. The semiconductor device of claim 3, wherein the each of the plurality of stages further includes a VDD line and at least one element that is connected to the VDD line, and wherein, in the each of the plurality of stages, one electrode of the protection diode is connected to the signal input line and the other electrode of the protection diode is connected to the VDD line.

* * * * *